(12) United States Patent
Ino

(10) Patent No.: US 10,403,815 B2
(45) Date of Patent: Sep. 3, 2019

(54) SEMICONDUCTOR DEVICE AND DIELECTRIC FILM

(71) Applicant: Toshiba Memory Corporation, Minato-ku (JP)

(72) Inventor: Tsunehiro Ino, Fujisawa (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 111 days.

(21) Appl. No.: 14/844,863

(22) Filed: Sep. 3, 2015

(65) Prior Publication Data

US 2016/0005961 A1    Jan. 7, 2016

Related U.S. Application Data

(63) Continuation of application No. PCT/JP2014/067582, filed on Jul. 1, 2014.

(30) Foreign Application Priority Data

Jul. 4, 2013    (JP) .................................. 2013-140431

(51) Int. Cl.
*H01L 45/00*    (2006.01)
*H01L 29/78*    (2006.01)
(Continued)

(52) U.S. Cl.
CPC ............ *H01L 45/06* (2013.01); *G11C 11/223* (2013.01); *H01L 27/1159* (2013.01); *H01L 27/11507* (2013.01); *H01L 28/40* (2013.01); *H01L 29/7843* (2013.01); *H01L 29/78391* (2014.09); *H01L 45/04* (2013.01);
(Continued)

(58) Field of Classification Search
None
See application file for complete search history.

(56) References Cited

U.S. PATENT DOCUMENTS 5,889,696 A * 3/1999 Kawakubo ............. G11C 11/22
365/145
2004/0147047 A1    7/2004 Cross et al.
(Continued)

FOREIGN PATENT DOCUMENTS

JP    2000-286396 A    10/2000
JP    2001-210794 A    8/2001
(Continued)

OTHER PUBLICATIONS

Böscke, T. S., et al. "Ferroelectricity in hafnium oxide: CMOS compatible ferroelectric field effect transistors." Electron Devices Meeting (IEDM), 2011 IEEE International. IEEE, 2011.*
(Continued)

*Primary Examiner* — Walter H Swanson
*Assistant Examiner* — Kien C Ly
(74) *Attorney, Agent, or Firm* — Oblon, McClelland, Maier & Neustadt, L.L.P.

(57) ABSTRACT

A semiconductor device according to an embodiment includes a first conductive layer, a second conductive layer, and a ferroelectric film or a ferrielectric film provided between the first conductive layer and the second conductive layer, the ferroelectric film or the ferrielectric film including hafnium oxide containing at least one first element selected from Zn, Mg, Mn, Nb, Sc, Fe, Cr, Co, In, Li and N.

10 Claims, 26 Drawing Sheets

(51) Int. Cl.
  *H01L 27/11507* (2017.01)
  *H01L 49/02* (2006.01)
  *G11C 11/22* (2006.01)
  *H01L 27/1159* (2017.01)

(52) U.S. Cl.
  CPC ...... *H01L 45/1233* (2013.01); *H01L 45/1253* (2013.01); *H01L 45/146* (2013.01)

(56) References Cited

U.S. PATENT DOCUMENTS

| | | | |
|---|---|---|---|
| 2004/0245492 A1 | 12/2004 | Hamada et al. | |
| 2005/0230727 A1* | 10/2005 | Tamura | G11C 11/22 257/295 |
| 2006/0214204 A1* | 9/2006 | Yoo | G11C 11/22 257/295 |
| 2007/0126045 A1* | 6/2007 | Choi | H01G 7/06 257/310 |
| 2009/0057737 A1* | 3/2009 | Boescke | H01L 21/28291 257/295 |
| 2009/0061538 A1* | 3/2009 | Heo | H01G 4/085 438/3 |
| 2009/0242970 A1* | 10/2009 | Shimizu | H01L 21/28273 257/326 |
| 2009/0244806 A1* | 10/2009 | Bhat | H01L 28/60 361/305 |
| 2009/0261395 A1 | 10/2009 | Boescke | |
| 2014/0080282 A1* | 3/2014 | Chiang | H01L 27/10852 438/396 |
| 2014/0355328 A1* | 12/2014 | Muller | G11C 11/2275 365/145 |
| 2015/0292949 A1* | 10/2015 | Noda | H01L 37/02 250/338.3 |

FOREIGN PATENT DOCUMENTS

| | | |
|---|---|---|
| JP | 2002-324892 A | 11/2002 |
| JP | 2003-224123 A | 8/2003 |
| JP | 2004-087754 A | 3/2004 |
| JP | 2004-172478 A | 6/2004 |
| JP | 2005-097073 A | 4/2005 |
| JP | 2006-270095 A | 10/2006 |
| JP | 2007-81378 A | 3/2007 |
| JP | 2007266228 A * | 10/2007 |

OTHER PUBLICATIONS

Lowther, J. E., et al. "Relative stability of ZrO 2 and HfO 2 structural phases." Physical Review B 60.21 (1999): 14485.*
U.S. Appl. No. 14/843,050, filed Sep. 2, 2015, Ino, et al.
International Search Report dated Aug. 26, 2014 for PCT/JP2014/067582 filed Jul. 1, 2014 with English Translation.
S. Mueller, et al., "Ferroelectricity in Gd-Doped $HfO_2$ Thin Films", ECS Journal of Solid State Science and Technology, 1 (6) N123-N126 (2012).
T.S. Boscke, et al., "Ferroelectricity in hafnium oxide thin films", Applied Physics Letters 99, 102903 (2011).
J. Mueller, et al., "Ferroelectric $Zr_{0.5}Hf_{0.5}O_2$ thin films for nonvolatile memory applications", Applied Physics Letters 99, 112901 (2011).
T.S. Boscke, et al., "Phase transitions in ferroelectric silicon doped hafnium oxide", Applied Physics Letters 99, 112904 (2011).

* cited by examiner

VOLTAGE APPLICATION, GENERATION OF POLARIZATION REVERSAL

PROPAGATION OF POLARIZATION REVERSAL

POLARIZATION REVERSAL IN WHOLE AREA

SEMICONDUCTOR DEVICE AND DIELECTRIC FILM

CROSS-REFERENCE TO RELATED APPLICATION

This application is continuation application of, and claims the benefit of priority from the International Application PCT/JP2014/067582, filed Jul. 1, 2014, which claims the benefit of priority from Japanese Patent Application No. 2013-140431, filed on Jul. 4, 2013, the entire contents of all of which are incorporated herein by reference.

FIELD

Embodiments described herein relate generally to a semiconductor device and a dielectric film.

BACKGROUND

In a nonvolatile memory, it is becoming difficult to scale down a floating gate (FG) type flash memory or a metal/oxide/nitride/oxide/silicon (MONOS) type flash memory. Therefore, scaling-down using an operation principle different from these memories has been continuously looked for. Nonvolatile memories having various structures, such as a ferroelectric random access memory (FeRAM), a resistive random access memory (ReRAM), a phase change random access memory (PCRAM), a magnetic random access memory (MRAM), or a three-dimensional memory have been examined.

Among these memories, ferroelectric memories such as FeRAM, FeFET (ferroelectric field effect transistor), FTJ (ferroelectric tunnel junction), ChainFeRAM (ferroelectric random access memory) etc. had the following problems. That is, the ferroelectric memories include a material difficult to handle, such as lead, and reduction in thickness of the Ferroelectric memories was difficult due to a size effect. Therefore, it was difficult to put the Ferroelectric memories into practical use except the FeRAM for a limited purpose, such as radio frequency identification (RFID) cards including a small-scale FeRAM for low power consumption.

In such a deadlock, a hafnium oxide film has been reported as a ferroelectric film not containing lead, not difficult to make a thin film thereof, capable of low voltage operation, that is, low power consumption operation, and capable of holding a record for a long time. It is expected to realize the Ferroelectric memories having a large capacity by using this hafnium oxide film.

DETAILED DESCRIPTION

A semiconductor device according to an embodiment includes a first conductive layer, a second conductive layer, and a ferroelectric film or a ferrielectric film provided between the first conductive layer and the second conductive layer, and the ferroelectric film or the ferrielectric film including hafnium oxide containing at least one first element selected from Zn, Mg, Mn, Nb, Sc, Fe, Cr, Co, In, Li and N.

Hereinafter, embodiments of the present disclosure will be described with reference to the drawings.

First Embodiment

A semiconductor device according to the present embodiment includes a first conductive layer, a second conductive layer, and a ferroelectric film or a ferrielectric film provided between the first conductive layer and the second conductive layer. The ferroelectric film or the ferrielectric film including hafnium oxide containing at least one first element selected from Zn, Mg, Mn, Nb, Sc, Fe, Cr, Co, In, Li and N.

Figure 1:
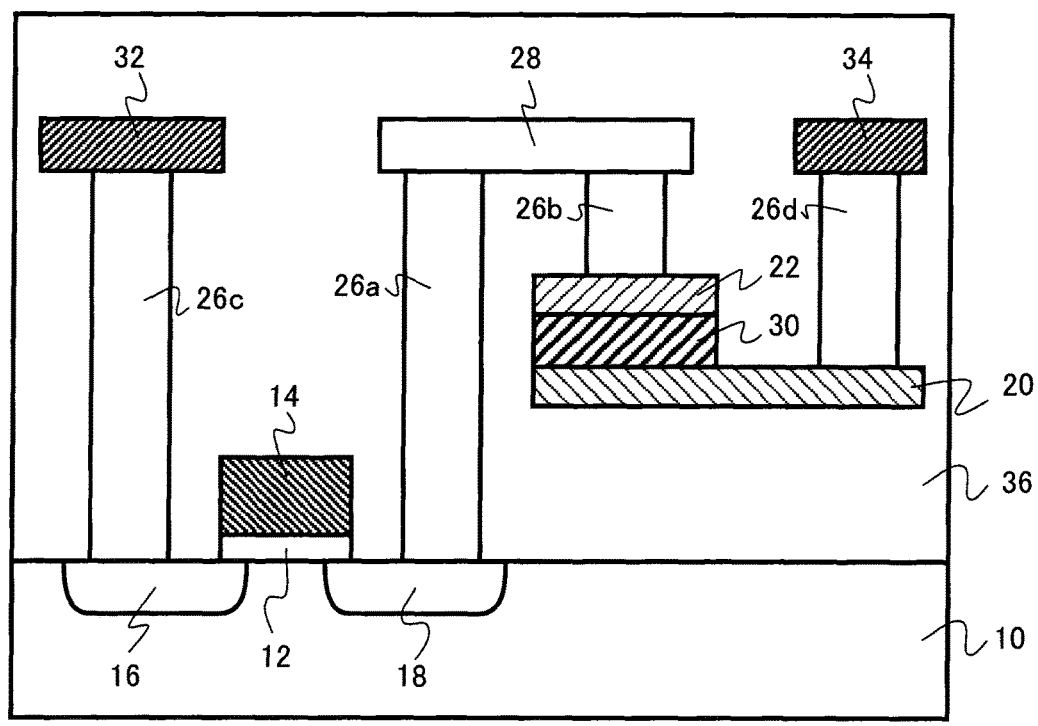
FIG. 1 is a schematic cross sectional view of a semiconductor device according to a first embodiment.

FIG. 1 is a schematic cross sectional view of the semiconductor device according to the present embodiment. The semiconductor device according to the present embodiment is a 1 transistor 1 capacitor type (1T1C type) FeRAM obtained by combining a capacitor using a ferroelectric substance or a ferrielectric substance as a dielectric film and a transistor for selecting a memory cell.

The semiconductor device according to the present embodiment includes a semiconductor substrate 10, a gate insulating film 12 formed on the semiconductor substrate 10, and a gate electrode 14 formed on the gate insulating film 12. A source impurity layer 16 and a drain impurity layer 18 are formed on a surface of the semiconductor substrate 10 on both sides of the gate electrode 14. The semiconductor substrate 10, the gate insulating film 12, the gate electrode 14, the source impurity layer 16, and the drain impurity layer 18 constitute a transistor for selecting a memory cell. The gate electrode 14 functions as a word line of the FeRAM.

The semiconductor substrate 10 is formed, for example, of silicon (Si). The gate insulating film 12 is, for example, a silicon oxide film. The gate electrode 14 is formed, for example, of polycrystalline silicon doped with an impurity. The source impurity layer 16 and the drain impurity layer 18 are formed, for example, by diffusing arsenic (As) as an n-type impurity in the semiconductor substrate 10.

In addition, the semiconductor device according to the present embodiment includes a lower capacitor electrode (first conductive layer) 20 and an upper capacitor electrode (second conductive layer) 22. A dielectric film 30 is formed between the lower capacitor electrode 20 and the upper capacitor electrode 22. The lower capacitor electrode 20, the upper capacitor electrode 22, and the dielectric film 30 constitute a capacitor for storing memory data.

The lower capacitor electrode 20 and the upper capacitor electrode 22 are formed, for example, of conductive metal or a conductive metal compound. An example thereof is TiN (titanium nitride).

The dielectric film 30 is a ferroelectric film or a ferrielectric film. The dielectric film 30 is formed of hafnium oxide containing at least one first element selected from Zn (zinc), Mg (magnesium), Mn (manganese), Nb (niobium), Sc (scandium), Fe (iron), Cr (chromium), Co (cobalt), In (indium), Li (lithium), and N (nitrogen). It is considered that existence of the above-described elements having valence numbers represented by $Zn^{2+}$ (zinc), $Mg^+$ (magnesium), $Mn^{2+}$ (manganese), $Nb^{3+}$ (niobium), $Sc^{3+}$ (scandium), $Fe^{3+}$ (iron (trivalent)), $Fe^{2+}$ (iron (divalent)), $Cr^{3+}$ (chromium), $Co^{2+}$ (cobalt), $In^{3+}$ (indium), $Li^+$ (lithium), and $N^{3-}$ (nitrogen) in hafnium oxide is observed by using an observation method such as X-ray photoemission spectroscopy (XPS).

The drain impurity layer 18 and the upper capacitor electrode 22 are electrically connected to each other via a contact plug 26a, wiring 28, and a contact plug 26b. The contact plug 26a, the wiring 28, and the contact plug 26b are formed, for example, of conductive metal or a conductive metal compound.

The semiconductor device according to the present embodiment includes a bit line 32 and a plate line 34. The bit line 32 is electrically connected to the source impurity layer 16 via a contact plug 26c. The plate line 34 is connected to the lower capacitor electrode 20 via a contact plug 26d. The bit line 32, the plate line 34, the contact plug 26c, and the contact plug 26d are formed, for example, of conductive metal or a conductive metal compound.

An interlayer insulating film 36 is provided among the wiring, the electrodes, and the contact plugs. The interlayer insulating film 36 is, for example, a silicon oxide film.

At the time of writing, the FeRAM according to the present embodiment selects a memory cell with the word line and applies a voltage between the bit line 32 and the plate line 34 to thereby change a polarization direction of the dielectric film 30. At the time of reading, the FeRAM applies a pulse voltage and determines 1/0 by a fact that a current has flowed or not due to polarization reversal.

Figure 2A:
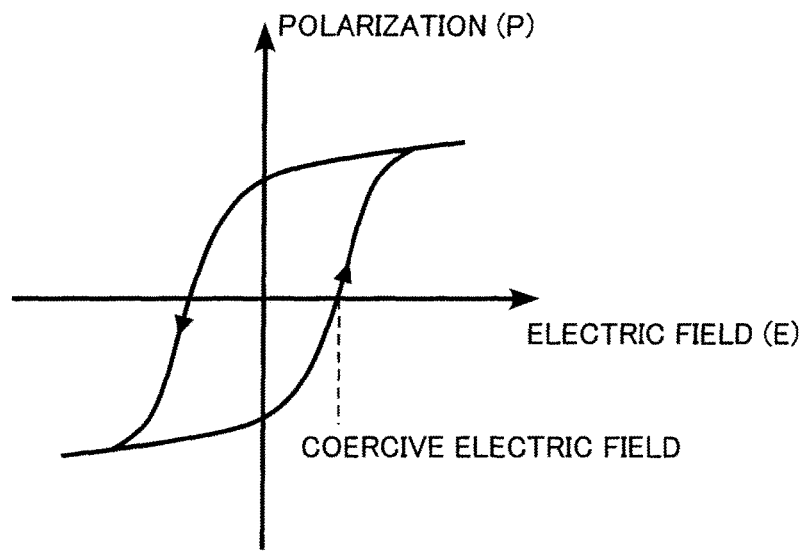
FIGS. 2A and 2B are diagrams describing ferroelectricity and ferrielectricity in the first embodiment.
Figure 2B:
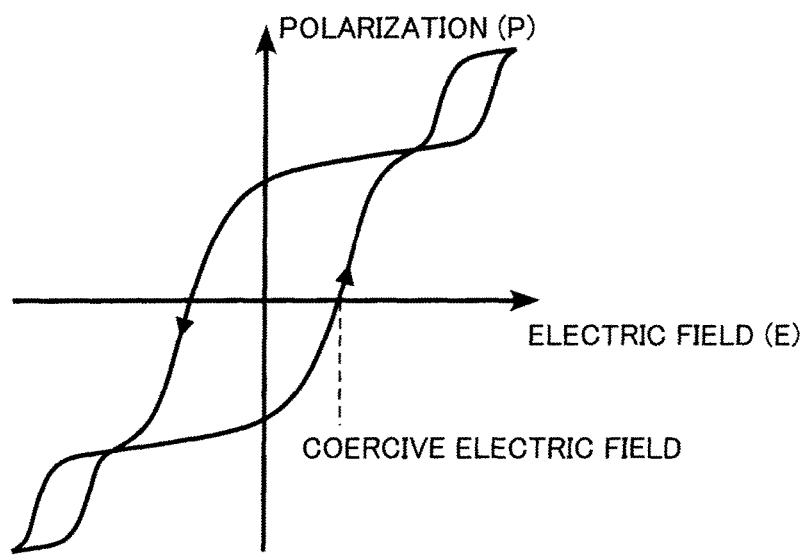

The dielectric film 30 according to the present embodiment is a ferroelectric film or a ferrielectric film having ferroelectricity and/or ferrielectricity. FIGS. 2A and 2B are diagrams describing ferroelectricity and ferrielectricity. FIG. 2A illustrates an electric field-polarization characteristic of the ferroelectric film. FIG. 2B illustrates an electric field-polarization characteristic of the ferrielectric film.

When an electric field is applied to the ferroelectric film, as illustrated in FIG. 2A, the size and direction of polarization change and a hysteresis curve is drawn. Polarization when an external electric field is zero is spontaneous polarization, a value thereof is residual polarization, and a strength of the electric field when the direction of polarization is reversed is a coercive electric field.

When an electric field is applied to the ferrielectric film, as illustrated in FIG. 2B, the size and direction of polarization change and a hysteresis curve is drawn as in the ferroelectric film. In the ferrielectric film, when an electric field larger than the coercive electric field is applied, spontaneous polarization different from spontaneous polarization when an external electric field is zero occurs. Therefore, in the electric field-polarization characteristic, another hysteresis curve is further added to a side of a higher electric field of the hysteresis curve of the ferroelectric film.

By containing at least one second element selected from Si (silicon), Ti (titanium), Zr (zirconium), Al (aluminum), Y (yttrium), La (lanthanum), Ce (cerium), Pr (praseodymium), Nd (neodium), Sm (samarium), Eu (europium), Gd (gadolinium), Tb (terbium), Dy (dysprosium), Ho (holmium), Er (erbium), Tm (thulium), Yb (ytterbium), Lu (lutetium), Ge (germanium), and Ga (gallium) in hafnium oxide, ferroelectricity or ferrielectricity is exhibited. The second element is preferably Si (silicon), Ti (titanium), Zr (zirconium), Al (aluminum), or Y (yttrium) from a viewpoint of exhibiting ferroelectricity or ferrielectricity.

The second element is preferably contained at 1 atom % or more and 5 atom % or less in hafnium oxide as a ferroelectric film or a ferrielectric film. This is because a value of residual polarization sufficient for operating as the FeRAM may not be obtained out of this range.

Figure 3A:
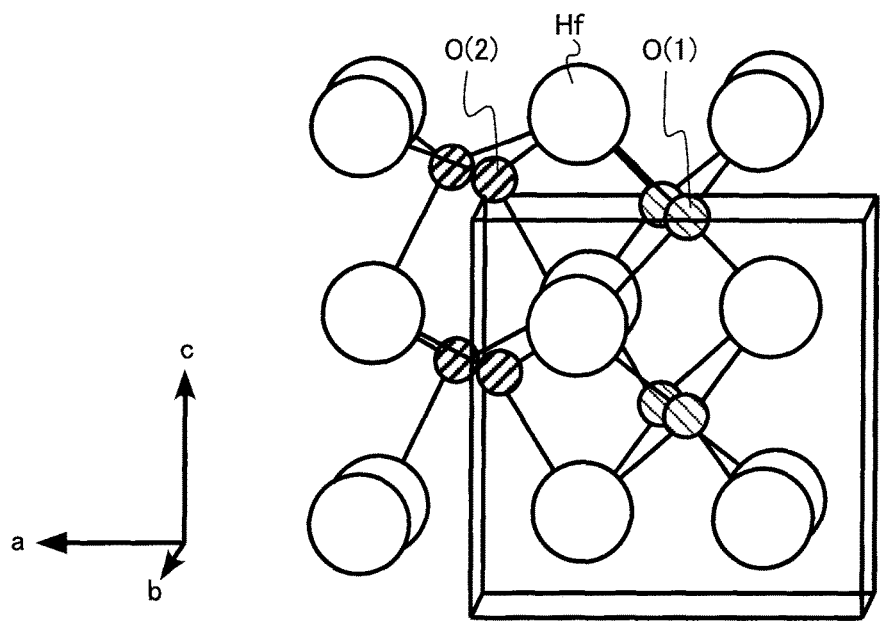
FIGS. 3A and 3B are diagrams describing hafnium oxide as a ferroelectric film or a ferrielectric film according to the first embodiment.
Figure 3B:
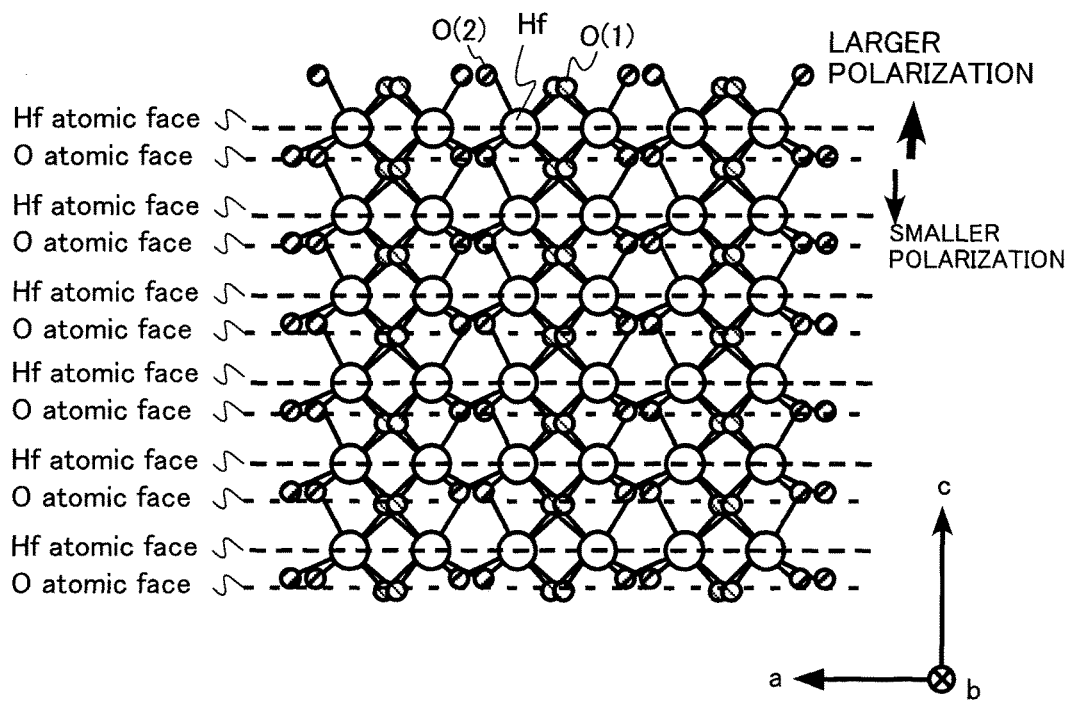

FIGS. 3A and 3B are views describing hafnium oxide as a ferroelectric film or a ferrielectric film. FIG. 3A describes a unit cell. FIG. 3B describes a relation between a crystal structure and polarization.

It is considered that a crystal of hafnium oxide as a ferroelectric film mainly has a third orthorhombic (orthorhombic III, space group Pbc2$_1$, space group number 29) structure. In the third orthorhombic structure, axial lengths are, for example, a=0.5069 nm, b=0.5226 nm, and c=0.5075 nm, and a unit cell volume is 0.1344 nm$^3$. A direction of each axis is illustrated in FIG. 3A.

It is considered that a crystal of hafnium oxide as the ferrielectric film includes a first orthorhombic (Pbca) phase, a tetragonal phase (P42/nmc), or a monoclinic (P21/c) phase in addition to the single third orthorhombic (Pbc2$_1$) phase.

As illustrated in FIG. 3A, in the unit cell of the third orthorhombic crystal, only one site of a Hf (hafnium) atom exists, but two sites of an O (oxygen) atom exist. Each site of the O atom is referred to as O(1) or O(2), as illustrated in FIG. 3A. An O atom existing in the O(2) site of the O atoms existing in the above-described two sites does not have reversal symmetry, and is considered to contribute to ferroelectricity or ferrielectricity.

The O atom existing in the O(2) site includes four stabilization points. When a rectangular parallelepiped cell having one eighth of the volume of the unit cell of fcc illustrated in FIG. 3A is considered, it is understood that two kinds of cells, that is, a cell with an O atom in the center and a cell without an O atom, are in contact with each other so as to form a checkered pattern in the cell having one eighth of the volume. The cell having one eighth of the volume includes Hf (hafnium) atoms at four apexes as a half of the eight apexes. The Hf atoms are tetrahedrally disposed.

While the O(1) site exists in the center of the tetrahedron formed by the Hf atoms, the O(2) site exists at a position further from one apex, that is, closer to one bottom surface than the center of the tetrahedron formed by the Hf atoms. These sites of the O atom exist at four positions in the one eighth cell.

In the tetrahedron formed by the Hf atoms, two sides are vertical to the c axial direction. The tetrahedron includes two faces of the tetrahedron sharing one side vertical to the c axial direction, and other two faces of the tetrahedron sharing the other side vertical to the c axial direction. Each of the O(2) stabilization points exists at a position close to each face. Therefore, the four O(2) stabilization points are divided into two kinds, that is, two O(2) stabilization points having an equivalent coordinate value in the c axial direction and two O(2) stabilization points having an equivalent coordinate value in the c axial direction, other than the above-described value. That is, reversal symmetry is lost in the c axial direction, and spontaneous polarization may occur in the c axial direction. As a result, ferroelectricity or ferrielectricity is exhibited.

As illustrated in FIG. 3B, it is assumed that O atoms are at certain stabilization points in the O(2) site, having an equivalent coordinate value in the c axial direction. At this time, by applying an electric field in the c axial direction, the O atoms in the O(2) site can take a coordinate value in the c axial direction, other than the above-described value. In this case, by changing the coordinate value of the O atom in the O (2) site in the c axial direction, a situation where a place having a narrow interval between a Hf atomic face and an O (2) atomic face and a place having a wide interval therebetween existed alternately, changes to a situation where the above-described place where the interval between the Hf atomic face and the O (2) atomic face was narrow becomes wide, and the place where the interval was wide becomes narrow.

The Hf atomic face has Hf$^{4+}$, i.e., a positive charge. The O atomic face has O$^{2-}$, i.e., a negative charge. Therefore, polarization occurs between the Hf atomic face and the O atomic face. As illustrated in FIG. 3B, polarization is large in the place where the interval between the Hf atomic face and the O atomic face is narrow, and polarization is small in the place where the interval between the Hf atomic face and the O atomic face is wide. Therefore, spontaneous polarization occurs in the c axial direction. It is understood that the interval between the Hf atomic face and the O atomic face is reversed and the polarization direction is reversed by changing the coordinate value of the O atom in the O (2) site in the c axial direction.

The dielectric film 30 formed of hafnium oxide having ferroelectricity or ferrielectricity preferably has a low coercive electric field while maintaining spontaneous polarization. This is because a write voltage or an erase voltage of the FeRAM can be reduced by lowering the coercive electric field.

In the present embodiment, as described above, the dielectric film 30 is formed of hafnium oxide as a ferroelectric film or a ferrielectric film. Hafnium oxide contains at least one first element selected from Zn (zinc), Mg (magnesium), Mn (manganese), Nb (niobium), Sc (scandium), Fe (iron), Cr (chromium), Co (cobalt), In (indium), Li (lithium), and N (nitrogen). By adding the first element, defective induction polarization reversal occurs, and it becomes possible to reduce the coercive electric field of the dielectric film 30 while maintaining the spontaneous polarization thereof.

Figure 4A:
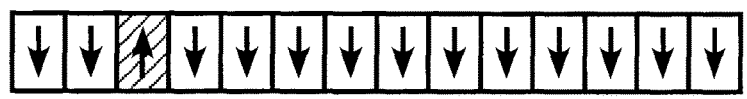
FIGS. 4A, 4B, and 4C are diagrams describing a function in the first embodiment.
Figure 4B:
Figure 4C:

FIGS. 4A, 4B, and 4C are diagrams describing a function in the present embodiment. In the polarization reversal of the ferroelectric substance, polarization in each domain does not occur completely independently but occurs cooperatively. That is, as in a phase transition phenomenon, when a part as a starting point of the polarization reversal is generated, the polarization reversal easily occurs around the part.

When the impurity defect is introduced by adding the above-described impurity into the dielectric film 30 as in the present embodiment, and a voltage is applied, as illustrated in FIG. 4A, the polarization reversal occurs in a relatively low electric field by using the impurity as a polarization reversal nucleus in a domain doped with the impurity. Thereafter, as illustrated in FIG. 4B, the polarization reversal occurs in a shape of an avalanche in an adjacent domain with the domain doped with the impurity as a starting point like a crystal-forming nucleus. Then, as illustrated in FIG. 4C, the polarization reversal in the whole area is completed in an electric field lower than an original polarization reversal electric field. That is, it becomes possible to reduce the coercive electric field while maintaining the spontaneous polarization.

It is desirable to cause such a phenomenon while an influence on other properties of ferroelectricity or ferrielectricity which hafnium oxide has, as small as possible. One example of such other properties is a residual polarization amount. For this purpose, preferably, the impurity does not easily affect the function causing ferroelectricity or ferrielectricity, such as a stress in the hafnium oxide crystal. That is, the impurity is preferably an atom having an ionic radius close to Hf$^{4+}$ or O$^{2-}$. In addition, in order to make the impurity function effectively as an electric defect, substitution with an atom having a valence different from Hf$^{4+}$ or O$^{2-}$ is desired.

From the above-described viewpoint, in the present embodiment, at least one of Zn, Mg, Mn, Nb, Sc, Fe, Cr, Co, In, and Li as an atom (element) substituted for Hf$^{4+}$ and N as an atom (element) substituted for O is added as the first element to hafnium oxide having ferroelectricity or ferrielectricity.

The first element is preferably Zn, Mg, Mn, Nb, or Sc. This is because each of $Zn^{2+}$, $Mg^{2+}$, $Mn^{2+}$, $Nb^{3+}$, and $Sc^{3+}$ particularly has an ionic radius close to $Hf^{4+}$.

Particularly, the first element is more preferably Sc. This is because Sc is nonvolatile due to a high melting point thereof and a high-temperature process can be applied during manufacture of a semiconductor device.

The first element is preferably contained at 1 atom % or more and 10 atom % or less in the dielectric film 30 as a ferroelectric film or a ferrielectric film. When the content is lower than this range, a sufficient effect of reducing the coercive electric field may not be obtained. When the content is higher than this range, a value of residual polarization sufficient for operating as the FeRAM may not be obtained.

For example, when $SiO_2$ at 3 atom % and ZnO at 5 atom % are added to hafnium oxide, that is, when Si is selected as the second element and Zn is selected as the first element, it is expected that ferroelectricity or ferrielectricity will be exhibited due to the addition of $SiO_2$, and that the coercive electric field will be reduced while the spontaneous polarization is maintained due to the addition of ZnO. $Si^{4+}$ has an ionic radius much smaller than $Hf^{4+}$. Therefore, the substitution in the Hf site makes distortion of the crystal larger, and a third orthorhombic crystal different from an original stable phase of hafnium oxide appears. However, $Si^{4+}$ has the same valence number as $Hf^{4+}$, and therefore, the coercive electric field is an original value of hafnium oxide. Here, the coercive electric field is reduced while the spontaneous polarization is maintained by adding ZnO.

For example, ferroelectricity or ferrielectricity may be caused by adding $Al_2O_3$ at 2 atom % to hafnium oxide, and the coercive electric field may be reduced while the spontaneous polarization is maintained by adding MgO at 7 atom % to hafnium oxide. In this case, the second element is Al, and the first element is Mg. A difference in the ionic radius between $Al^{3+}$ and $Hf^{4+}$ is large. Therefore, $Al^{3+}$ has a distortion effect with respect to the hafnium oxide crystal like $Si^{4+}$. Meanwhile, $Al^{3+}$ has a valence number different from $Hf^{4+}$. Therefore, $Al^{3+}$ itself reduces the coercive electric field while maintaining the spontaneous polarization. However, when an addition amount of $Al_2O_3$ is increased in order to reduce the coercive electric field while maintaining the spontaneous polarization, a too large distortion is given to the hafnium oxide crystal. As a result, hafnium oxide may not exhibit ferroelectricity or ferrielectricity. Therefore, Mg is added as an addition element not affecting exhibition of ferroelectricity or ferrielectricity of hafnium oxide but reducing the coercive electric field of hafnium oxide.

For example, ferroelectricity or ferrielectricity may be exhibited by adding $Y_2O_3$ to hafnium oxide. In this case, the second element is Y. In order to reduce the coercive electric field while maintaining the spontaneous polarization, at least one of Zn, Mg, Mn, Nb, Sc, Fe, Cr, Co, In, and Li as an atom (element) substituted for $Hf^{4+}$ and N as an atom (element) substituted for O is added as the first element.

For example, ferroelectricity or ferrielectricity may be exhibited by adding $ZrO_2$, that is, Zr as the second element to hafnium oxide, and the coercive electric field may be reduced while the spontaneous polarization is maintained by adding N as the first element.

The impurity in hafnium oxide can be analyzed, for example, by a secondary ion-microprobe mass spectrometry (SIMS) method, an Auger electron spectroscopy (AES) method, an X-ray photoelectron spectroscopy (XPS) method, or a high resolution-Rutherford back scattering (HR-RBS) method.

As described in detail in a second embodiment, it is desired to apply a compressive stress in a thickness direction of the dielectric film 30 as the ferroelectric film or the ferrielectric film from a view point of further reducing the coercive electric field.

In the present embodiment, not only the reduction in the coercive electric field but also a change from the ferroelectric hafnium oxide to the ferrielectric hafnium oxide may occur. When the dielectric film 30 is a ferrielectric film, a smaller coercive electric field and larger residual polarization than those of a ferroelectric film may be exhibited.

In the semiconductor device according to the present embodiment, the coercive electric field is reduced by adding the first element to the ferroelectric film or the ferrielectric film formed of hafnium oxide. Therefore, the semiconductor device which operates at a low operating voltage and reduces power consumption can be realized.

Second Embodiment

A semiconductor device according to the present embodiment includes a first conductive layer, a second conductive layer, and a ferroelectric film or a ferrielectric film provided between the first conductive layer and the second conductive layer and formed of hafnium oxide in which a compressive stress is applied in a thickness direction. Except a structure of the ferroelectric film or the ferrielectric film, and application of the compressive stress, the semiconductor device according to the present embodiment is similar to that of the first embodiment. Therefore, some contents overlapping with the first embodiment are not described.

Figure 5:
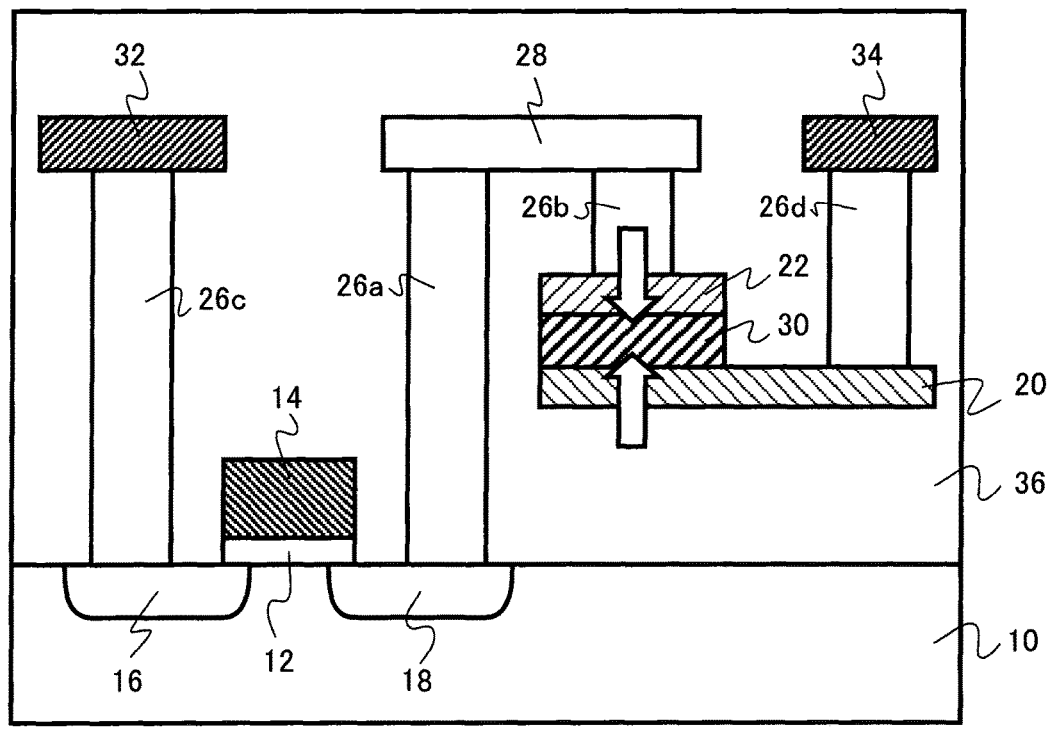
FIG. 5 is a schematic cross sectional view of a semiconductor device according to a second embodiment.

FIG. 5 is a schematic cross sectional view of the semiconductor device according to the present embodiment. The semiconductor device according to the present embodiment is a 1 transistor 1 capacitor type (1T1C type) FeRAM obtained by combining a capacitor using a ferroelectric substance or a ferrielectric substance as a dielectric film and a transistor for selecting a memory cell.

The semiconductor device according to the present embodiment includes a lower capacitor electrode (first conductive layer) 20 and an upper capacitor electrode (second conductive layer) 22. A dielectric film 30 is formed between the lower capacitor electrode 20 and the upper capacitor electrode 22. The lower capacitor electrode 20, the upper capacitor electrode 22, and the dielectric film 30 constitute a capacitor for storing memory data.

The dielectric film 30 is a ferroelectric film or a ferrielectric film. The dielectric film 30 is formed of hafnium oxide in which a compressive stress is applied in a thickness direction. That is, a stress is applied in a direction indicated by a white arrow in FIG. 5.

Figure 6:
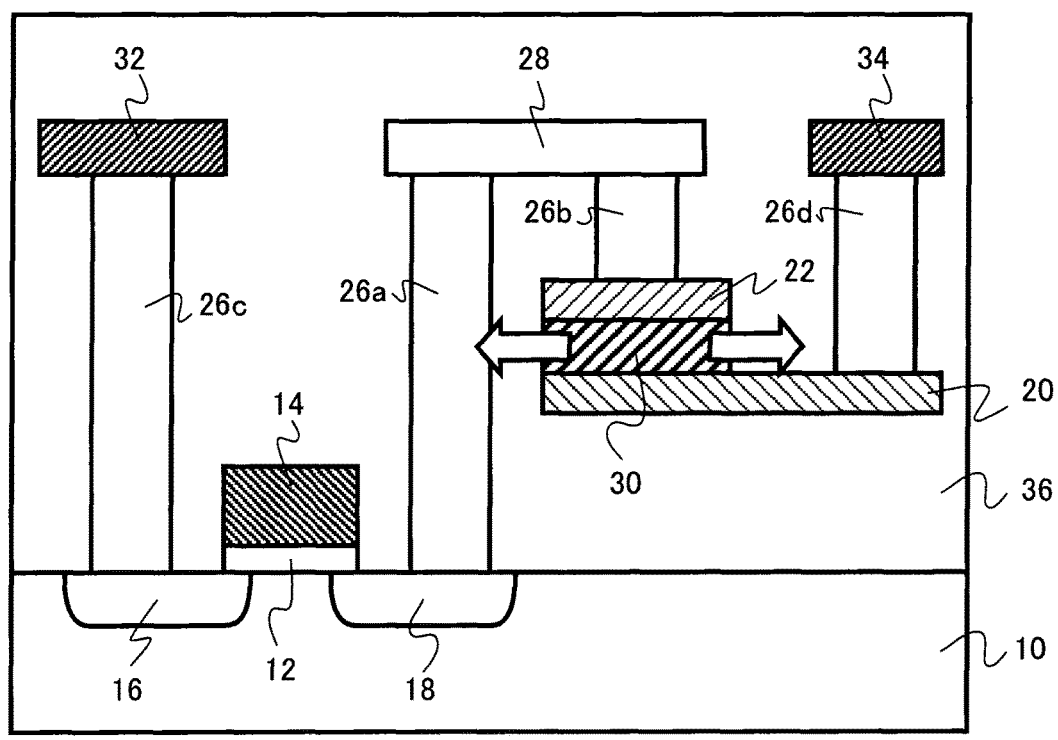
FIG. 6 is a diagram describing a stress applied to a dielectric film according to a second embodiment.

FIG. 6 is a diagram describing a stress applied to the dielectric film according to the present embodiment. Here, the phrase "a compressive stress is applied in a thickness direction" means that a stress applied to the dielectric film 30 is substantially in a compressed direction in the thickness direction. For example, as illustrated by the white arrow in FIG. 6, when a tensile stress is applied in a direction perpendicular to the thickness direction of the dielectric film 30, the compressive stress in the thickness direction is substantially derived with a Poisson's ratio based on the tensile stress. Therefore, this case is also expressed by the phrase "a compressive stress is applied in a thickness direction."

The dielectric film 30 preferably contains at least one second element selected from Si, Ti, Zr, Al, and Y in order to exhibit ferroelectricity or ferrielectricity. The second element is preferably contained at 1 atom % or more and 5 atom % or less in the ferroelectric film or the ferrielectric film. This is because a value of residual polarization sufficient for operating as the FeRAM may not be obtained out of this range.

As described above, hafnium oxide having ferroelectricity or ferrielectricity is a third orthorhombic crystal. c axis in the third orthorhombic crystal is not an axis having the longest crystal axis of the orthorhombic crystal. The longest axis is b axis, and the shortest axis is a axis. b axis and a axis are both perpendicular to a polarization direction.

The length of c axis is close to the length of a axis which is the shortest, and much shorter than that of b axis which is the longest. Therefore, it can be said that the third orthorhombic crystal has a structure close to a tetragonal crystal in which the lengths of a axis and c axis are the same. Ferroelectricity or ferrielectricity is exhibited in such a third orthorhombic crystal, while ferroelectricity or ferrielectricity is not exhibited in the tetragonal crystal. Therefore, it is possible to reduce a coercive electric field in the ferroelectric substance or the ferrielectric substance by enhancing symmetry of a crystal.

In the FeRAM in the present embodiment, a hafnium oxide crystal contributing to a memory operation by spontaneous polarization among the hafnium oxide crystals in the dielectric film 30 is generally a crystal in which c axis is in the thickness direction. In the present embodiment, by applying a compressive stress in the thickness direction of the dielectric film 30, the crystal contributing to the memory operation is compressed in a c axial direction, and the symmetry of the crystal is relatively enhanced. That is, by making the length of a axis close to that of c axis, the crystal is made close to the tetragonal crystal. Therefore, the coercive electric field of the dielectric film 30 is reduced.

A method for applying a compressive stress in the thickness direction of the dielectric film 30 is not particularly limited. For example, a compressive stress may be applied mechanically from an outside of a semiconductor device. An example of the method for mechanically applying a compressive stress from an outside of a semiconductor device is a method of pinching the semiconductor device with a clamp or the like.

For example, a compressive stress may be applied by using an internal film structure of the semiconductor device. Various methods for applying a compressive stress by using the internal film structure are considered. Hereinafter, some methods are illustrated.

Figure 7A:
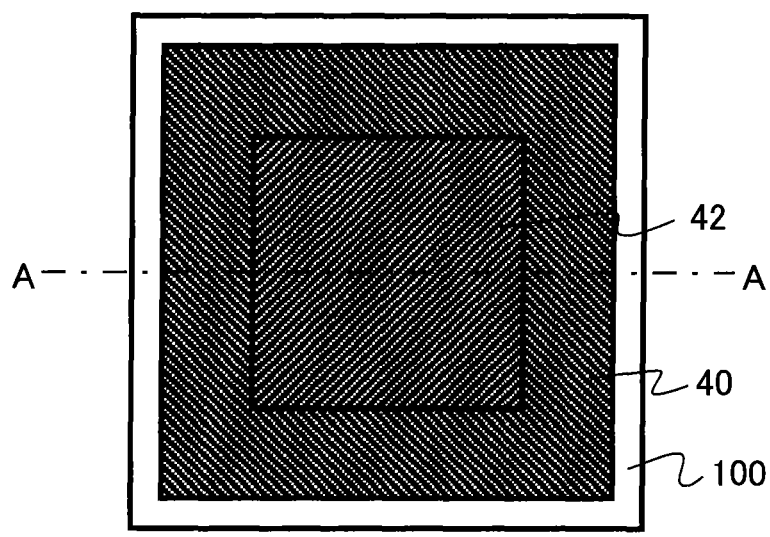
FIGS. 7A and 7B are diagrams describing a method for applying a compressive stress in the second embodiment.
Figure 7B:
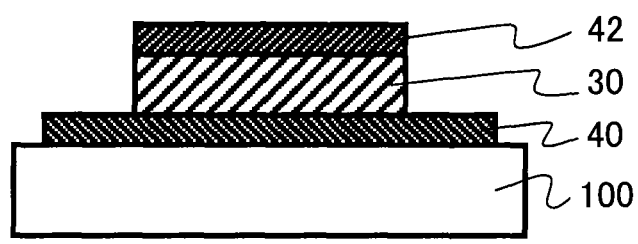

FIGS. 7A and 7B are diagrams describing a method for applying a compressive stress in the present embodiment. FIG. 7A is a plan view of a film structure, and FIG. 7B is an AA cross sectional view of FIG. 7A.

The dielectric film 30 formed of hafnium oxide and having ferroelectricity or ferrielectricity is provided on a substrate 100. The dielectric film 30 is interposed between a first stress applying layer 40 and a second stress applying layer 42. FIGS. 7A and 7B are diagrams describing the method for applying a compressive stress. Therefore, a film structure not having a large influence on the stress to the dielectric film 30 is not illustrated.

The first stress applying layer 40 has a coefficient of thermal expansion smaller than the dielectric film 30. The second stress applying layer 42 also has a coefficient of thermal expansion smaller than the dielectric film 30.

For example, as illustrated in FIGS. 7A and 7B, a film structure in which the dielectric film 30 is interposed between the first stress applying layer 40 and the second stress applying layer 42 having a coefficient of thermal expansion smaller than the dielectric film 30 is formed, and then, processes of heating and cooling are performed.

Immediately after heating, the dielectric film 30 is not in a molten state but has fluidity. That is, bonding between the dielectric film 30 and each of the first stress applying layer 40 and the second stress applying layer 42 is relaxed and each stress in the film is small.

On the other hand, in the cooling process, for example, the fluidity of the dielectric film 30 is lowered around 800° C. where the crystallinity is enhanced, and bonding between the dielectric film 30 and each of the first stress applying layer 40 and the second stress applying layer 42 is strengthened. A thermal contraction amount of the dielectric film 30 is larger than that of the first stress applying layer 40 or the second stress applying layer 42. Therefore, the dielectric film 30 receives a biaxial tensile stress from the first stress applying layer 40 or the second stress applying layer 42 in a direction perpendicular to the thickness direction. Therefore, a compressive stress is applied in the thickness direction of the dielectric film 30 with the Poisson's ratio.

For example, in FIG. 1, the following method is considered. That is, the lower capacitor electrode 20 is used as the first stress applying layer 40 having a coefficient of thermal expansion smaller than the dielectric film 30, and the upper capacitor electrode 22 is used as the second stress applying layer 42 having a coefficient of thermal expansion smaller than the dielectric film 30. In this case, the first stress applying layer 40 and the second stress applying layer 42 are conductive materials.

Examples of the conductive material having a coefficient of thermal expansion smaller than hafnium oxide include a metal nitride, a metal carbide, and a metal boride. Specific examples thereof include CrN, TaN, MoC, WC, $W_2C$, TaC, $HfB_2$, $B_4C$, $Mo_2B$, an alloy thereof, and a mixture thereof.

In the metal boride, conductivity of a semiconductor substrate as a base may be influenced by diffusion of B (boron). From this viewpoint, CrN, TaN, MoC, WC, $W_2C$, or TaC is preferably applied.

Among the metal nitrides, the coefficient of thermal expansion of TiN is 9.4E-6/K, which is larger than the coefficient of thermal expansion of hafnium oxide 6.5E-6/K.

For example, it is also possible to apply a compressive stress in the thickness direction of the dielectric film 30 by interposing the first stress applying layer 40 having low electrical conductivity and a coefficient of thermal expansion smaller than the dielectric film 30 between the dielectric film 30 and the lower capacitor electrode 20, and by interposing the second stress applying layer 42 having low electrical conductivity and a coefficient of thermal expansion smaller than the dielectric film 30 between the dielectric film 30 and the upper capacitor electrode 22, in FIG. 1.

Examples of the material having low electrical conductivity and a coefficient of thermal expansion smaller than the dielectric film 30 include SiC, AlN, $Si_3N_4$, $SiB_6$, and $AlTiO_4$.

FIGS. 7A and 7B illustrate the structure in which the dielectric film 30 is interposed between the first stress applying layer 40 and the second stress applying layer 42. However, it is possible to apply a compressive stress in the thickness direction of the dielectric film 30 even when only one of the first stress applying layer 40 and the second stress applying layer 42 exists. The first stress applying layer 40 and the second stress applying layer 42 are not necessarily required to cover the whole upper and lower areas of the dielectric film 30.

The above-described processes of heating and cooling may be performed not after the first stress applying layer 40 or the second stress applying layer 42 is formed but while the first stress applying layer 40 or the second stress applying layer 42 is formed. For example, the dielectric film 30, and the first stress applying layer 40 or the second stress applying layer 42 may be formed during heating.

Figure 8A:
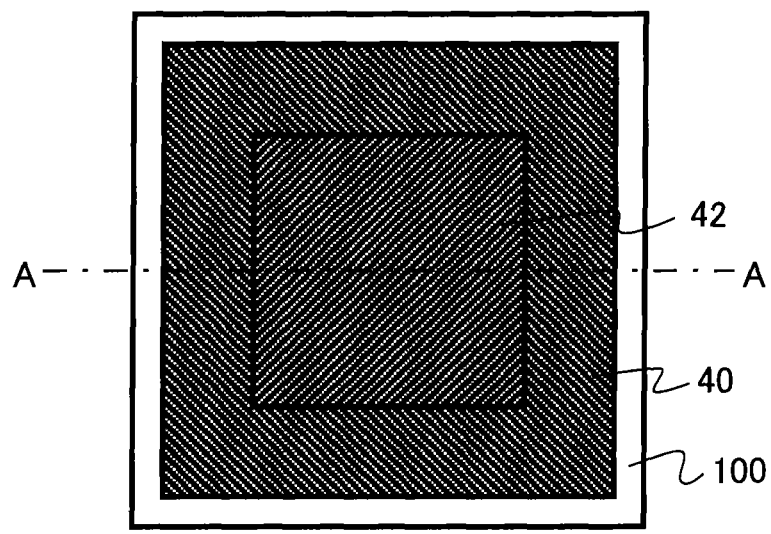
FIGS. 8A and 8B are diagrams describing another method for applying a compressive stress in the second embodiment.
Figure 8B:
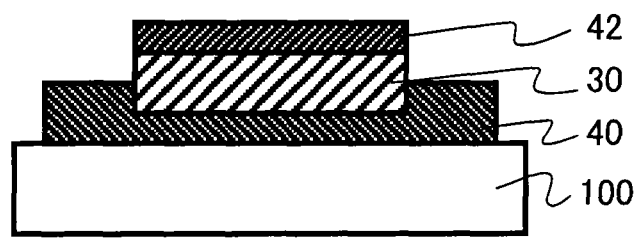

FIGS. 8A and 8B are diagrams describing another method for applying a compressive stress in the present embodiment. FIG. 8 A is a plan view of a film structure, and FIG. 8B is an AA cross sectional view of FIG. 8A.

The dielectric film 30 formed of hafnium oxide and having ferroelectricity or ferrielectricity is provided on the substrate 100. The dielectric film 30 is interposed between the first stress applying layer 40 and the second stress applying layer 42. The first stress applying layer 40 has a coefficient of thermal expansion smaller than the dielectric film 30. The second stress applying layer 42 also has a coefficient of thermal expansion smaller than the dielectric film 30.

The first stress applying layer 40 is in contact with the bottom surface and the side surfaces of the dielectric film 30. In this film structure, it is possible to apply a compressive stress in the thickness direction of the dielectric film 30 more effectively than in the case of FIGS. 7A and 7B.

Figure 9A:
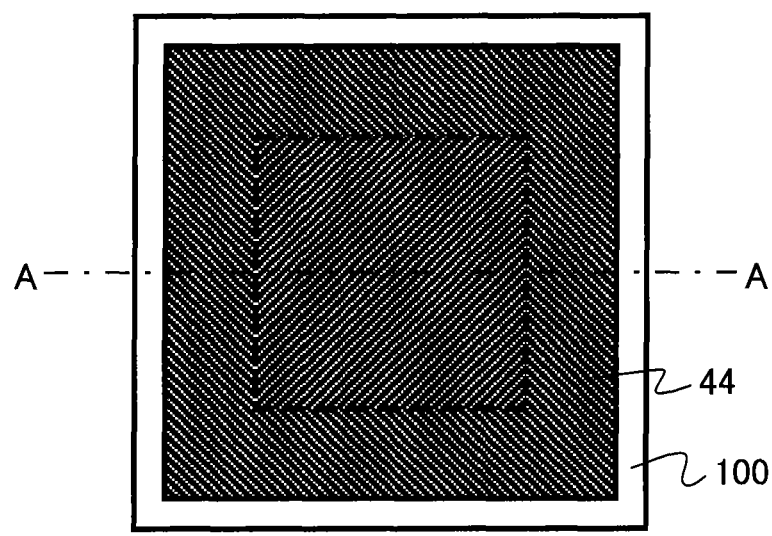
FIGS. 9A and 9B are diagrams describing another method for applying a compressive stress in the second embodiment.
Figure 9B:
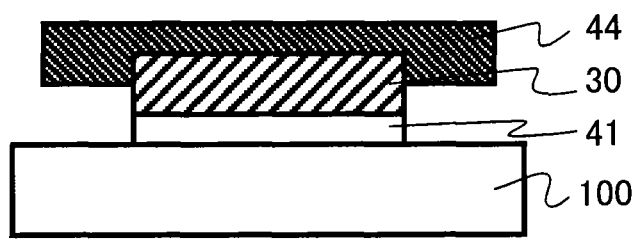

FIGS. 9A and 9B are diagrams describing another method for applying a compressive stress according to the present embodiment. FIG. 9 A is a plan view of a film structure, and FIG. 9B is an AA cross sectional view of FIG. 9A.

The dielectric film 30 formed of hafnium oxide and having ferroelectricity or ferrielectricity is provided on the substrate 100. The dielectric film 30 is interposed between a layer 41 having no stress applying effect and a stress applying layer 44. The stress applying layer 44 has a coefficient of thermal expansion smaller than the dielectric film 30.

The stress applying layer 44 is in contact with the upper surface and the side surfaces of the dielectric film 30. Also in this film structure, it is possible to apply a compressive stress in the thickness direction of the dielectric film 30.

Figure 10A:
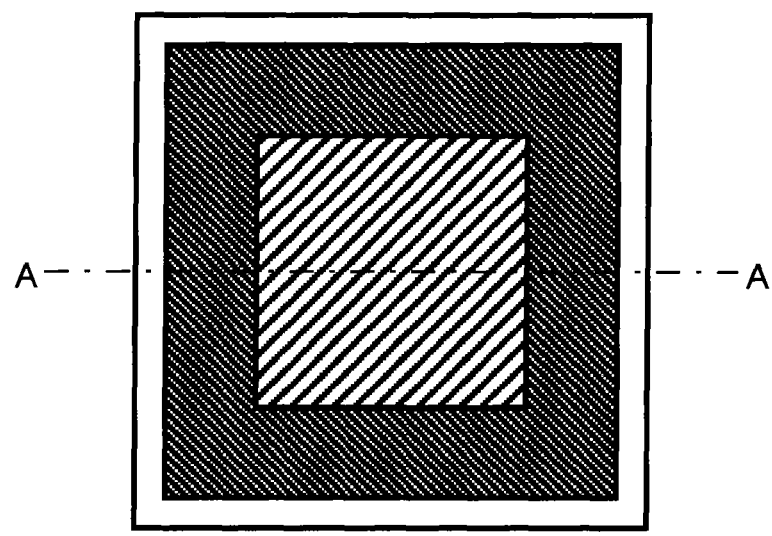
FIGS. 10A and 10B are diagrams describing another method for applying a compressive stress in the second embodiment.
Figure 10B:
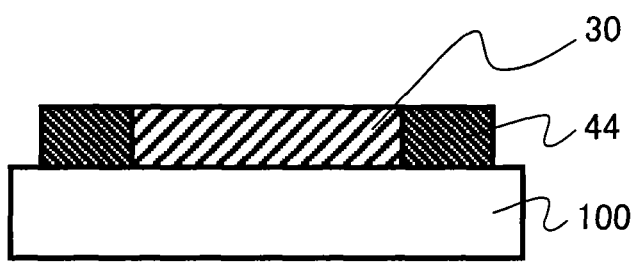

FIGS. 10A and 10B are diagrams describing another method for applying a compressive stress in the present embodiment. FIG. 10 A is a plan view of a film structure, and FIG. 10B is an AA cross sectional view of FIG. 10A.

The dielectric film 30 formed of hafnium oxide and having ferroelectricity or ferrielectricity is provided on the substrate 100. The side surfaces of the dielectric film 30 are annularly surrounded by the stress applying layer 44. The stress applying layer 44 has a coefficient of thermal expansion smaller than the dielectric film 30. Also in this film structure, it is possible to apply a compressive stress in the thickness direction of the dielectric film 30.

The film structures in FIGS. 8A, 8B, 9A, 9B, 10A, and 10B illustrate methods for applying a compressive stress in the thickness direction of the dielectric film 30 using the stress applying layer having a coefficient of thermal expansion smaller than the dielectric film 30 formed of hafnium oxide and having ferroelectricity or ferrielectricity. On the other hand, it is also possible to apply a compressive stress in the thickness direction of the dielectric film 30 using a stress applying layer having a coefficient of thermal expansion larger than the dielectric film 30.

Figure 11A:
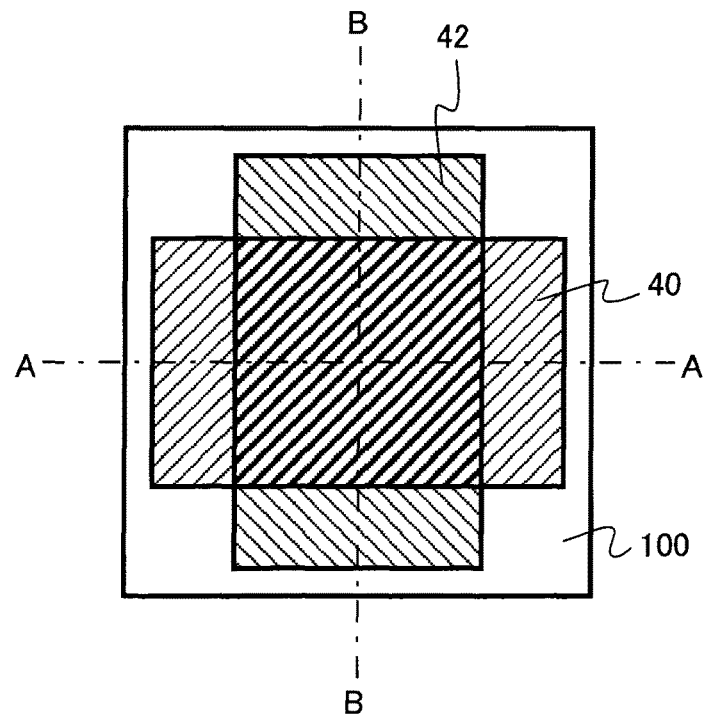
FIGS. 11A, 11B, and 11C are diagrams describing another method for applying a compressive stress in the second embodiment.
Figure 11B:
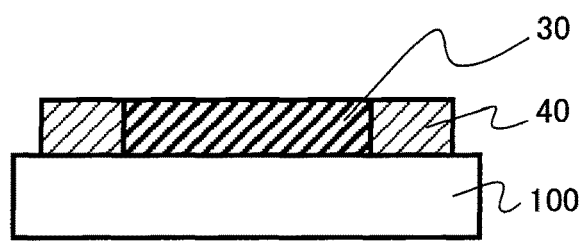
Figure 11C:
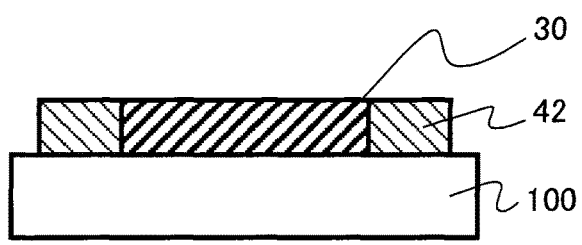

FIGS. 11A, 11B, and 11C are diagrams describing another method for applying a compressive stress in the present embodiment. FIG. 11 A is a plan view of a film structure, FIG. 11B is an AA cross sectional view of FIG. 11A, and FIG. 11C is a BB cross sectional view of FIG. 11A.

The dielectric film 30 formed of hafnium oxide and having ferroelectricity or ferrielectricity is provided on the substrate 100. The side surfaces of the dielectric film 30 are surrounded by the first stress applying layer 40 and the second stress applying layer 42. The first stress applying layer 40 and the second stress applying layer 42 are in contact with the side surfaces of the dielectric film 30. The first stress applying layer 40 is formed of a material having a coefficient of thermal expansion larger than the dielectric film 30. The second stress applying layer 42 is also formed of a material having a coefficient of thermal expansion larger than the dielectric film 30.

In this film structure, it is possible to apply a biaxial tensile stress in a direction perpendicular to the thickness direction of the dielectric film 30. Therefore, it is possible to apply a compressive stress in the thickness direction of the dielectric film 30 with the Poisson's ratio.

The first stress applying layer 40 and the second stress applying layer 42 may be formed of the same material or different materials. FIG. 11 illustrates the dielectric film 30 surrounded by the four divided stress applying layers. However, the number of division is not limited to four. It is also possible to make the stress applying layer form splitting, dislocation collapse, or grain boundary spontaneously by large thermal contraction thereof during cooling without deliberately forming division. When the division, the splitting, the dislocation face, the grain boundary, or the like does not exist in the stress applying layer at all, it is not possible to apply a tensile stress to the dielectric film 30.

In FIGS. 11 A, 11B, and 11C, it is possible to apply a uniaxial tensile stress in a direction perpendicular to the thickness direction of the dielectric film 30 by forming one of the first stress applying layer 40 and the second stress applying layer 42 of a material having a coefficient of thermal expansion larger than the dielectric film 30, and by forming the other one of a material having a coefficient of thermal expansion smaller than the dielectric film 30. Also by this method, it is possible to apply a compressive stress in the thickness direction of the dielectric film 30 with the Poisson's ratio.

In FIGS. 11 A, 11B, and 11C, it is possible to apply a uniaxial tensile stress in a direction perpendicular to the thickness direction of the dielectric film 30 by providing only one of the first stress applying layer 40 and the second stress applying layer 42, and by forming the stress applying layer of a material having a coefficient of thermal expansion larger or smaller than the dielectric film 30. Also by this method, it is possible to apply a compressive stress in the thickness direction of the dielectric film 30 with the Poisson's ratio.

Figure 12A:
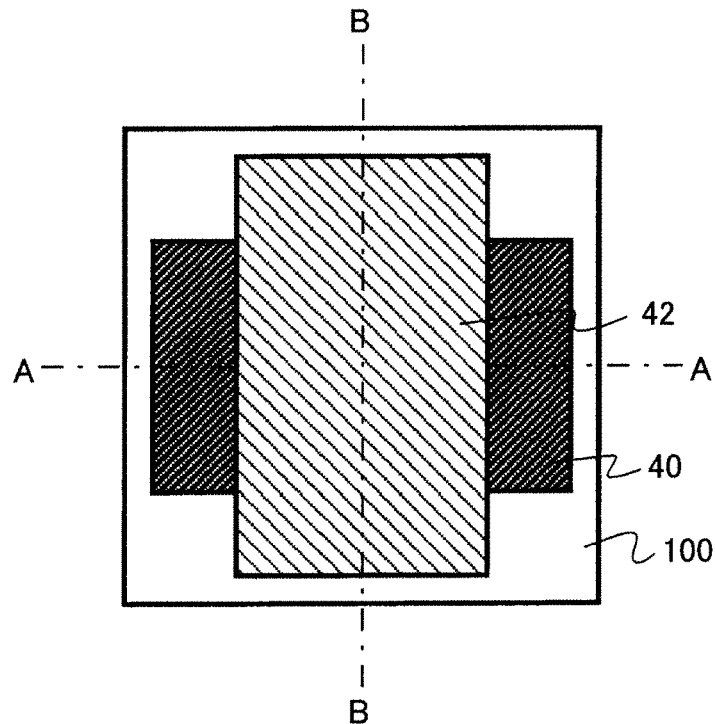
FIGS. 12A, 12B, and 12C are diagrams describing another method for applying a compressive stress in the second embodiment.
Figure 12B:
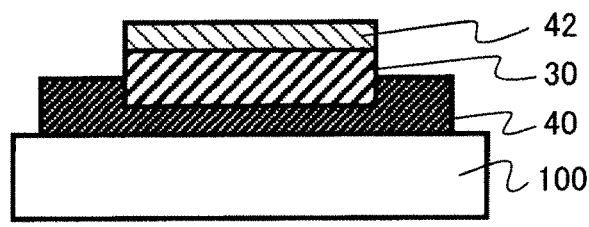
Figure 12C:
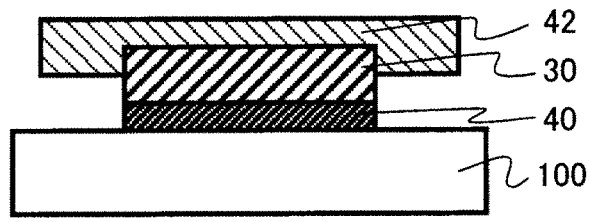

FIGS. 12A, 12B, and 12C are diagrams describing another method for applying a compressive stress in the present embodiment. FIG. 12 A is a plan view of a film structure, and FIG. 12B is an AA cross sectional view of FIG. 12A, and FIG. 12C is a BB cross sectional view of FIG. 12A.

The dielectric film 30 formed of hafnium oxide and having ferroelectricity or ferrielectricity is provided on the substrate 100. The dielectric film 30 is interposed between the first stress applying layer 40 and the second stress applying layer 42. The first stress applying layer 40 has a coefficient of thermal expansion larger than the dielectric film 30. The second stress applying layer 42 has a coefficient of thermal expansion smaller than the dielectric film 30.

The first stress applying layer 40 is in contact with the bottom surface and the side surfaces of the dielectric film 30. The second stress applying layer 42 is in contact with the upper surface and the side surfaces of the dielectric film 30. In this film structure, it is possible to apply a uniaxial tensile stress in a direction perpendicular to the thickness direction of the dielectric film 30. Therefore, it is possible to apply a compressive stress in the thickness direction of the dielectric film 30 with the Poisson's ratio.

The first stress applying layer 40 may be formed of a material having a coefficient of thermal expansion smaller than the dielectric film 30. The second stress applying layer 42 may be formed of a material having a coefficient of thermal expansion larger than the dielectric film 30.

The method for applying a compressive stress in the thickness direction of the dielectric film 30 includes a method using film formation in a non-equilibrium state, such as a sputtering process. In the sputtering process, a film is formed by flicking off a target atom when argon gas or the like in a plasma state goes into the target. At this time, a small amount of the argon gas or the like also goes into the film. Therefore, it is possible to apply a compressive stress in the thickness direction of the dielectric film 30 by interposing the argon gas or the like between atoms of the dielectric film 30 formed on the substrate.

Figure 13:
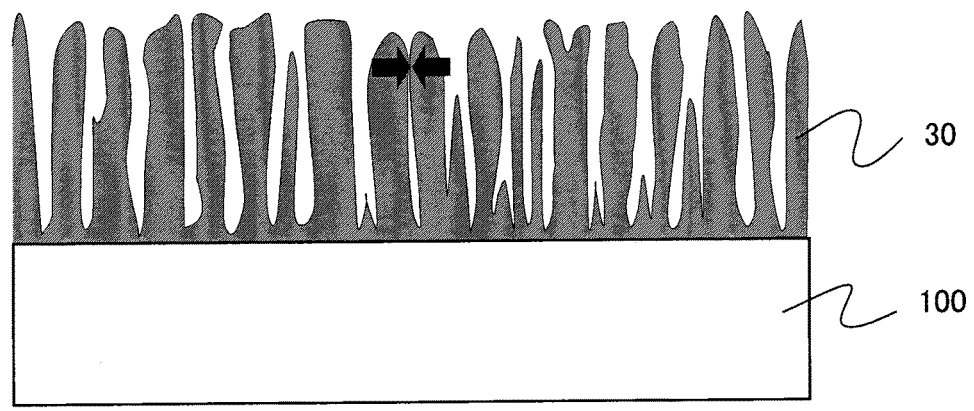
FIG. 13 is a diagram describing another method for applying a compressive stress in the second embodiment.

FIG. 13 is a diagram describing another method for applying a compressive stress in the present embodiment. In the sputtering process, as illustrated in FIG. 13, the dielectric film 30 having a pillar-shaped film structure is formed on the substrate 100. Here, it is possible to make a gap between the pillars relatively small by changing sputtering conditions. Then, as illustrated by a black arrow in FIG. 13, it is possible to apply a tensile stress in a direction perpendicular to the thickness direction of the dielectric film 30 by spontaneous bonding between the pillars. As a result, it is possible to apply a compressive stress in the thickness direction of the dielectric film 30 with the Poisson's ratio.

As described above, forming the compressive stress state and the tensile stress state separately in the sputtering process depends on a device parameter of each sputtering device, and cannot be easily described generally. However, for example, the compressive stress state is easily generated when a sputtering gas pressure is low, and the tensile stress state is easily generated when the sputtering gas pressure is high. In such a case, the sputtering gas is contained at about 1% in the film.

Such a method for applying a stress using plasma is not limited to the sputtering method. For example, it is possible to make a stress state also by putting a sample in plasma, for example, of argon after film formation.

Existence of the sputtering gas including a rare gas element such as argon at about 1% in the hafnium oxide film can be checked, for example, by transmission electron microscope-energy dispersive X-ray spectroscopy (TEM-EDX), electron energy loss spectroscopy (EELS), or the high resolution-Rutherford back scattering (HR-RBS) method.

As the method for applying a compressive stress in the thickness direction of the dielectric film 30, for example, it is also considered to interpose the dielectric film 30 between films having a lattice constant slightly larger than the dielectric film 30. At this time, a part or the whole of the interposing films is preferably epitaxially bonded with the interposed dielectric film 30. By this method, it is possible to apply a tensile stress in a direction perpendicular to the thickness direction of the dielectric film 30. As a result, it is possible to apply a compressive stress in the thickness direction of the dielectric film 30 with the Poisson's ratio. This method is particularly effective when hafnium oxide as the dielectric film 30 is a single crystal.

For example, if a spacing of hafnium oxide of the third orthorhombic crystal in a <111> direction is made to match to a spacing of a TiN electrode in the <111> direction at a ratio of 4:5, a mismatch of the spacing is about 3%, and epitaxial stacking can be made. On the other hand, when a TaN electrode is used in place of the TiN electrode, the mismatch is 5.7% in the 4:5 matching as in TiN, because the lattice constant of TaN is slightly larger than that of TiN. However, TaN has a coefficient of thermal expansion much smaller than TiN. Therefore, for example, the mismatch is reduced at a high temperature of 800° C., and epitaxial stacking can be made. It is also possible to apply a stress using a material making the lattice constant larger than that of TiN, for example, HfN, NbN, ZrN, or ScN.

In the present embodiment, not only the reduction in the coercive electric field but also a change from the ferroelectric hafnium oxide to the ferrielectric hafnium oxide may occur. When the dielectric film 30 is a ferrielectric film, a smaller coercive electric field and larger residual polarization than those of a ferroelectric film may be exhibited.

A stress applied to the dielectric film or the stress applying layer manufactured by the above-described methods can be examined by a diffraction experiment with an X-ray, an electron beam, etc., a method with a transmission electron microscope (TEM) and Fourier transform, a Raman scattering experiment, an infrared spectroscopy experiment, or the like.

For example, in the experiment by Raman scattering, a stress of the dielectric film 30 itself may be examined, or the stress of the dielectric film 30 may be measured indirectly by measuring a stress of the substrate such as silicon as the base of the dielectric film 30. When the stress is measured indirectly, for example, by using a peak around 510 kayser of silicon, the peak is shifted to a lower kayser side by about 4 kayser per 1 GPa in the biaxial tensile stress. On the contrary, when a compressive stress is applied, the shift direction is reversed.

A sharp peak exists near 390 kayser in the Raman spectrum of the hafnium oxide film used in the present embodiment. However, the peak is shifted to a lower kayser side by about 1.6 kayser per 1 GPa by applying a biaxial tensile stress. On the contrary, when a compressive stress is applied, the shift direction is reversed. Almost the same value as this peak shift amount is obtained also in the infrared spectroscopy experiment.

In the methods by the X-ray or the electron beam diffraction, the TEM, and the Fourier transform, the lattice constant is reduced by about 0.1% per 1 GPa in the biaxial compressive stress. In the present embodiment, the biaxial or uniaxial tensile stress is preferably 0.2 GPa or more and 1.0 GPa or less. When the tensile stress is less than 0.2 GPa, an effect of reducing the coercive electric field may not be sufficient. When the tensile stress is more than 1.0 GPa, a life of an element may be short.

In the semiconductor device according to the present embodiment, the coercive electric field is reduced by applying a compressive stress in the thickness direction to the ferroelectric film or the ferrielectric film formed of hafnium oxide. Therefore, the semiconductor device which operates at a low operating voltage and reduces power consumption can be realized.

Third Embodiment

A semiconductor device according to the present embodiment is similar to that in the first embodiment except that the semiconductor device according to the present embodiment is a 1 transistor type (1T type) FeRAM (FeFET). A structure of a dielectric film is similar to that in the first embodiment. Therefore, some contents overlapping with the first embodiment are not described.

Figure 14:
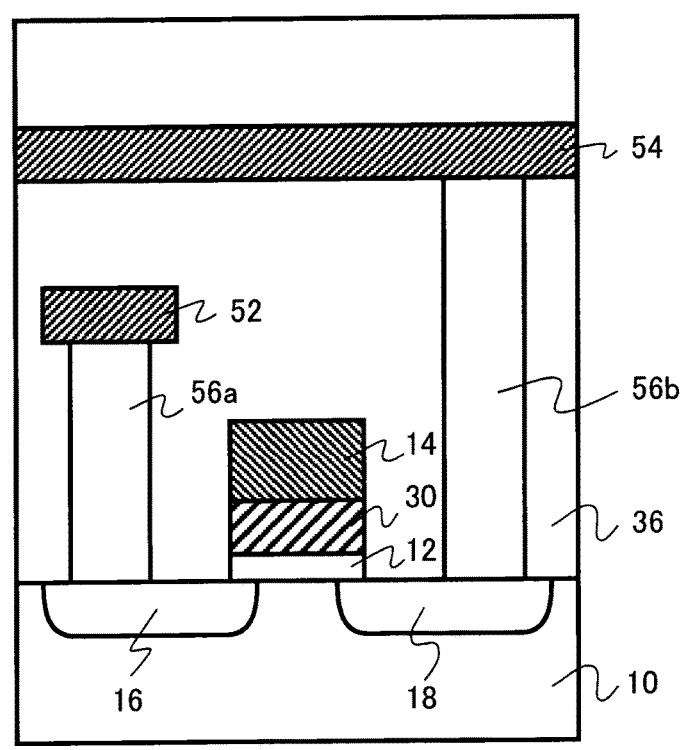
FIG. 14 is a schematic cross sectional view of a semiconductor device according to a third embodiment.

FIG. 14 is a schematic cross sectional view of the semiconductor device according to the present embodiment. The semiconductor device according to the present embodiment is the 1 transistor type (1T type) FeFET including a capacitor of a ferroelectric substance or a ferrielectric substance. This type of memory is also described as FeFET (Ferroelectric FET) memory.

The semiconductor device according to the present embodiment includes a semiconductor substrate (first conductive layer) 10, a gate insulating film 12 formed on the semiconductor substrate 10, a dielectric film 30 formed on the gate insulating film 12, and a gate electrode (second conductive layer) 14 formed on the dielectric film 30. Unlike the 1T type in the related art, the gate insulating film 12 is not necessarily required in the present embodiment. A driving force of a transistor can be enhanced by not including the gate insulating film 12. Therefore, this is advantageous for scaling-down. This structure is possible just because a ferroelectric substance containing hafnium oxide mainly or at about a half content in the dielectric film 30 is used in the present embodiment. Even if an insulating film similar to the gate insulating film 12 is formed by oxidation of the base when the dielectric film 30 is formed, there is no trouble for operating the semiconductor device according to the present embodiment. A source impurity layer (source region) 16 and a drain impurity layer (drain region) 18 are formed at a surface of the semiconductor substrate 10 on both sides of the gate electrode 14.

The semiconductor substrate 10, the gate insulating film 12, the dielectric film 30, the gate electrode 14, the source impurity layer 16, and the drain impurity layer 18 constitute a transistor for selecting a memory cell. The semiconductor substrate 10, the gate insulating film 12, the dielectric film 30, and the gate electrode 14 constitute a capacitor for storing memory data. The gate electrode 14 functions as a word line of the FeFET.

The semiconductor substrate 10 is formed, for example, of silicon (Si). The gate insulating film 12 is, for example, a silicon oxide film. The gate electrode 14 is formed, for example, of conductive metal or a conductive metal compound. An example thereof is TiN (titanium nitride). The source impurity layer 16 and the drain impurity layer 18 are formed, for example, by diffusing arsenic (As) as an n-type impurity in the semiconductor substrate 10.

The dielectric film 30 is a ferroelectric film or a ferrielectric film. The dielectric film 30 is formed of hafnium oxide containing at least one first element selected from Zn (zinc), Mg (magnesium), Mn (manganese), Nb (niobium), Sc (scandium), Fe (iron), Cr (chromium), Co (cobalt), In (indium), Li (lithium), and N (nitrogen).

The semiconductor device according to the present embodiment includes a first bit line 52 and a second bit line 54. The first bit line 52 is electrically connected to the source impurity layer 16 via a contact plug 56a. The second bit line 54 is connected to the drain impurity layer 18 via a contact plug 56b. The first bit line 52, the second bit line 54, the contact plug 56a, and the contact plug 56b are formed, for example, of conductive metal or a conductive metal compound.

An interlayer insulating film 36 is provided among the wiring, the electrodes, and the contact plugs. The interlayer insulating film 36 is, for example, a silicon oxide film.

At the time of writing (programming), the FeFET according to the present embodiment selects a memory cell with the word line 15 and applies a voltage between the word line 15 and the first and second bit lines 52, 54 to thereby change a polarization direction of the dielectric film 30. The word line 15 may be positively biased and the first bit line 52 and the second bit line 54 may be fixed to ground potential. At the time of erasing, a voltage is applied between the word line 15 and the semiconductor substrate 11, thereby change a polarization direction of the dielectric film 30. The word line 15 may be fixed to ground potential and the semiconductor substrate 11 may be positively biased. The first bit line 52 and the second bit line 54 may be kept floating. At the time of reading, the FeFET determines 1/0 with a current value flowing between the first bit line 52 and the second bit line 54.

In the semiconductor device according to the present embodiment, the coercive electric field is reduced while the spontaneous polarization is maintained by adding the first element to the ferroelectric film or the ferrielectric film formed of hafnium oxide. Therefore, the semiconductor device which operates at a low operating voltage and reduces power consumption can be realized.

Fourth Embodiment

A semiconductor device according to the present embodiment is similar to that in the second embodiment except that the semiconductor device according to the present embodiment is a 1 transistor type (1T type) FeRAM (FeFET). A structure of a dielectric film is similar to that in the second embodiment. Therefore, some contents overlapping with the second embodiment are not described.

Figure 15:
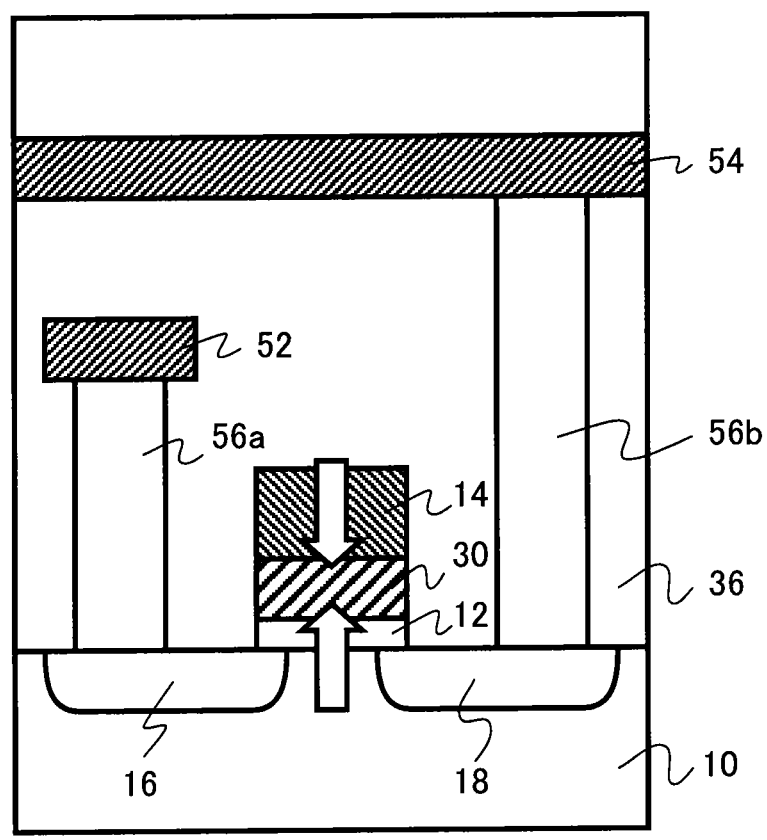
FIG. 15 is a schematic cross sectional view of a semiconductor device according to a fourth embodiment.

FIG. 15 is a schematic cross sectional view of the semiconductor device according to the present embodiment. The semiconductor device according to the present embodiment is the 1 transistor type (1T type) FeRAM including a capacitor of a ferroelectric substance or a ferrielectric substance. This type of memory is also described as FeFET (Ferroelectric FET) memory.

The semiconductor device according to the present embodiment includes a semiconductor substrate (first conductive layer) 10, a gate insulating film 12 formed on the semiconductor substrate 10, a dielectric film 30 formed on the gate insulating film 12, and a gate electrode (second conductive layer) 14 formed on the dielectric film 30. The gate insulating film 12 is not necessarily required in the present embodiment because of a similar reason to that in the third embodiment. A source impurity layer 16 and a drain impurity layer 18 are formed at a surface of the semiconductor substrate 10 on both sides of the gate electrode 14.

The semiconductor substrate 10, the gate insulating film 12, the dielectric film 30, the gate electrode 14, the source impurity layer 16, and the drain impurity layer 18 constitute a transistor for selecting a memory cell. The semiconductor substrate 10, the gate insulating film 12, the dielectric film 30, and the gate electrode 14 constitute a capacitor for storing memory data. The gate electrode 14 functions as a word line of the FeFET.

The semiconductor substrate 10 is formed, for example, of silicon (Si). The gate insulating film 12 is, for example, a silicon oxide film. The gate electrode 14 is formed, for example, of conductive metal or a conductive metal compound. An example thereof is TiN (titanium nitride). The source impurity layer 16 and the drain impurity layer 18 are formed, for example, by diffusing arsenic (As) as an n-type impurity in the semiconductor substrate 10.

The dielectric film 30 is a ferroelectric film or a ferrielectric film. The dielectric film 30 is formed of hafnium oxide in which a compressive stress is applied in a thickness direction. That is, a stress is applied in a direction indicated by a white arrow in FIG. 15. This compressive stress may be a stress applied with a Poisson's ratio based on a tensile stress in a film in-plane direction.

The semiconductor device according to the present embodiment includes a first bit line 52 and a second bit line 54. The first bit line 52 is electrically connected to the source impurity layer 16 via a contact plug 56a. The second bit line 54 is connected to the drain impurity layer 18 via a contact plug 56b. The first bit line 52, the second bit line 54, the contact plug 56a, and the contact plug 56b are formed, for example, of conductive metal or a conductive metal compound.

An interlayer insulating film 36 is provided among the wiring, the electrodes, and the contact plugs. The interlayer insulating film 36 is, for example, a silicon oxide film.

At the time of writing (programming), the FeFET according to the present embodiment selects a memory cell with the word line 15 and applies a voltage between the word line 15 and the first and second bit lines 52, 54 to thereby change a polarization direction of the dielectric film 30. The word line 15 may be positively biased and the first bit line 52 and the second bit line 54 may be fixed to ground potential. At the time of erasing, a voltage is applied between the word line 15 and the semiconductor substrate 11, thereby change a polarization direction of the dielectric film 30. The word line 15 may be fixed to ground potential and the semiconductor substrate 11 may be positively biased. The first bit line 52 and the second bit line 54 may be kept floating. At the time of reading, the FeFET determines 1/0 with a current value flowing between the first bit line 52 and the second bit line 54.

In the semiconductor device according to the present embodiment, the coercive electric field is reduced by applying a compressive stress in the thickness direction to the ferroelectric film or the ferrielectric film formed of hafnium oxide. Therefore, the semiconductor device which operates at a low operating voltage and reduces power consumption can be realized.

Fifth Embodiment

A semiconductor device according to the present embodiment is different from that in the first or third embodiment in that the semiconductor device according to the present embodiment is a nonvolatile semiconductor device having a three-dimensional structure using a so-called bit-cost scalable (BiCS) technology. A dielectric film itself is similar to that in the first or third embodiment. Therefore, some contents overlapping with the first or third embodiment are not described.

Figure 16:
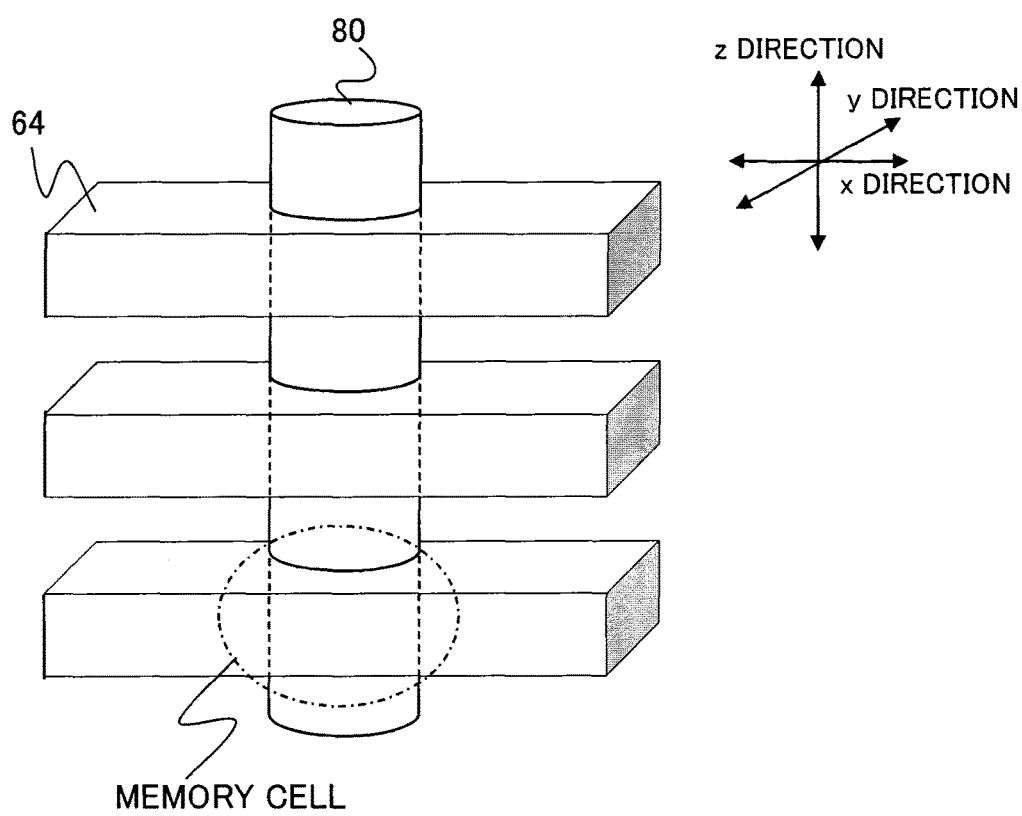
FIG. 16 is a three-dimensional conceptual diagram of a semiconductor device according to a fifth embodiment.
Figure 17:
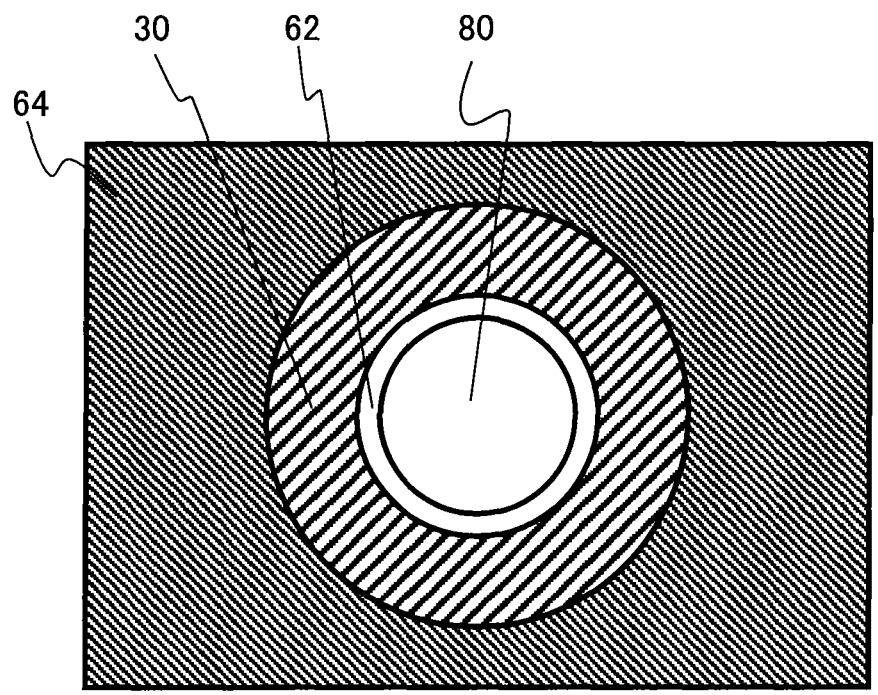
FIG. 17 is an XY schematic cross sectional view of FIG. 16.
Figure 17:
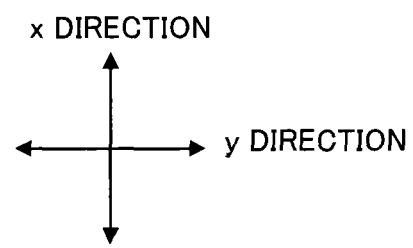
Figure 18:
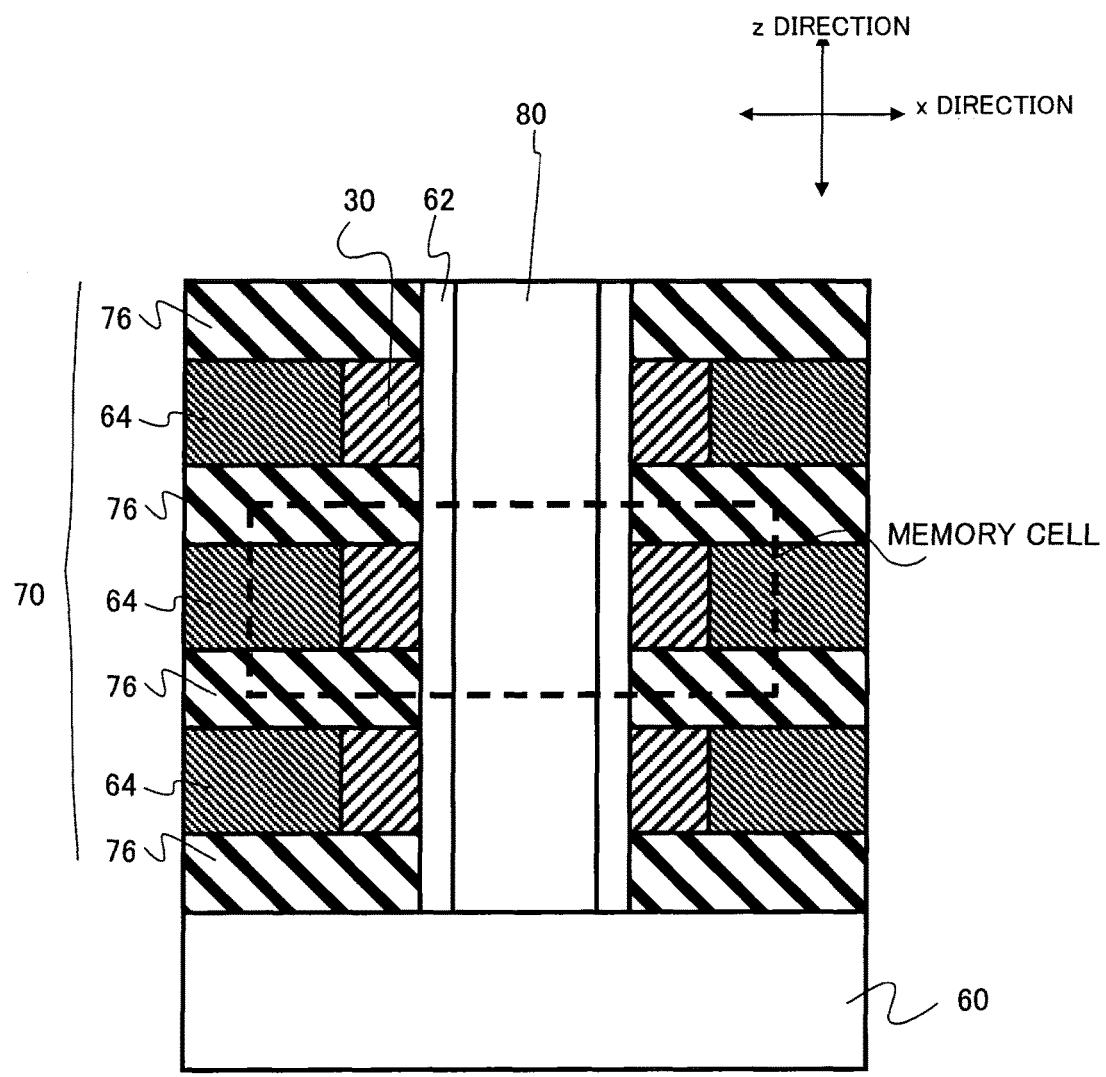
FIG. 18 is an XZ schematic cross sectional view of FIG. 16.

FIG. 16 is a three-dimensional conceptual diagram of the semiconductor device according to the present embodiment. FIG. 17 is an XY schematic cross sectional view of FIG. 16. FIG. 18 is an XZ schematic cross sectional view of FIG. 16.

The semiconductor device according to the present embodiment, for example, includes a stacked body 70 having an insulating layer 76 and a control gate electrode layer 64 stacked plurally and alternately on a silicon substrate 60. The insulating layer 76 is, for example, a silicon oxide film. The control gate electrode layer (second conductive layer) 64 is formed, for example, of polycrystalline silicon doped with an impurity and provided with conductivity.

A hole penetrating from the upper surface of the stacked body 70 to the control gate electrode layer 64 as the lowest layer is provided. A dielectric film 30 is provided on a side surface of the control gate electrode layer 64 in the hole.

The dielectric film 30 is a ferroelectric film or a ferrielectric film. The dielectric film 30 is formed of hafnium oxide containing at least one first element selected from Zn (zinc), Mg (magnesium), Mn (manganese), Nb (niobium), Sc (scandium), Fe (iron), Cr (chromium), Co (cobalt), In (indium), Li (lithium), and N (nitrogen).

Furthermore, a gate insulating film 62 is provided on an inner surface of the dielectric film 30. The gate insulating film 62 is, for example, a silicon oxide film. The gate insulating film 62 is not necessarily required in the present embodiment. This is because of the same reason as in the third embodiment.

A pillar-shaped semiconductor layer (first conductive layer) 80 is formed on an inner surface of the gate insulating film 62. The semiconductor substrate 80 is formed, for example, of silicon (Si).

In FIGS. 16 and 18, an area surrounded by a broken line is one memory cell. In a structure of the memory cell, the gate insulating film 62 is formed on the semiconductor layer (first conductive layer) 80, the dielectric film 30 is formed on the gate insulating film 62, and the control gate electrode layer 64 is formed on the dielectric film 30. This memory cell is a cell of the 1 transistor type FeFET, and these cells are longitudinally connected in series.

In the semiconductor device according to the present embodiment, the coercive electric field is reduced while the spontaneous polarization is maintained by adding the first element to the ferroelectric film or the ferrielectric film formed of hafnium oxide. Therefore, the semiconductor device which operates at a low operating voltage and reduces power consumption can be realized.

In addition, according to the present embodiment, an integration degree of the memory cell is enhanced by making the memory cell three-dimensional, and it is possible to realize the semiconductor device having a higher integration degree than that in the first or fourth embodiment.

Figure 19:
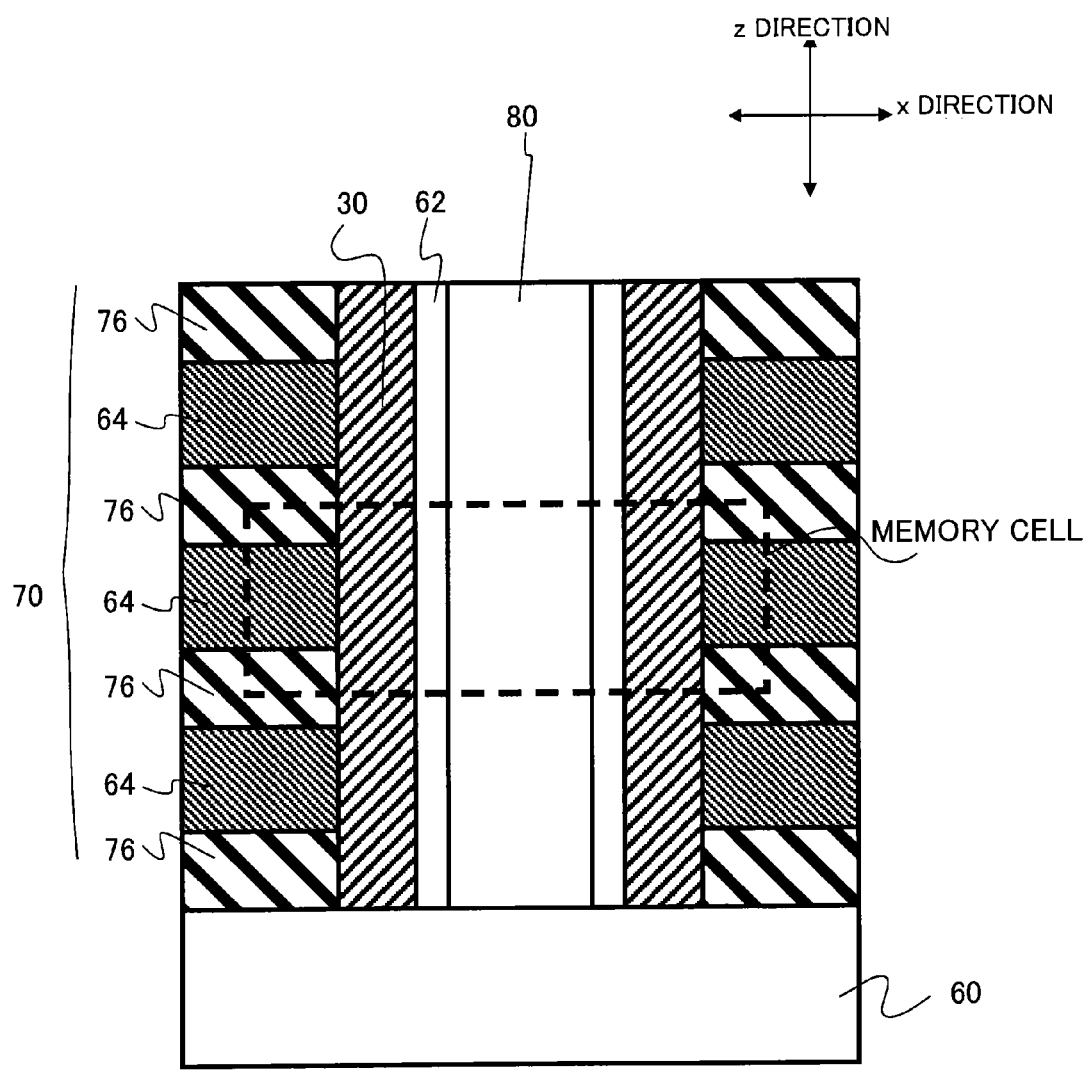
FIG. 19 is a schematic cross sectional view of a semiconductor device according to a modification example of the fifth embodiment.

FIG. 19 is a schematic cross sectional view of a semiconductor device according to a modification example of the present embodiment. The semiconductor device according to the modification example is similar to that in the above-described embodiment except that the dielectric film 30 is not divided for each memory cell and continuous in the semiconductor device according to the modification example. Also in this modification example, it is possible to obtain similar effects to those in the above-described embodiment.

Sixth Embodiment

A semiconductor device according to the present embodiment is different from that in the second or fourth embodiment in that the semiconductor device according to the present embodiment is a nonvolatile semiconductor device having a three-dimensional structure using a so-called bit-cost scalable (BiCS) technology. A structure of a dielectric film is similar to that in the second or fourth embodiment. Therefore, some contents overlapping with the second or fourth embodiment are not described.

Figure 20:
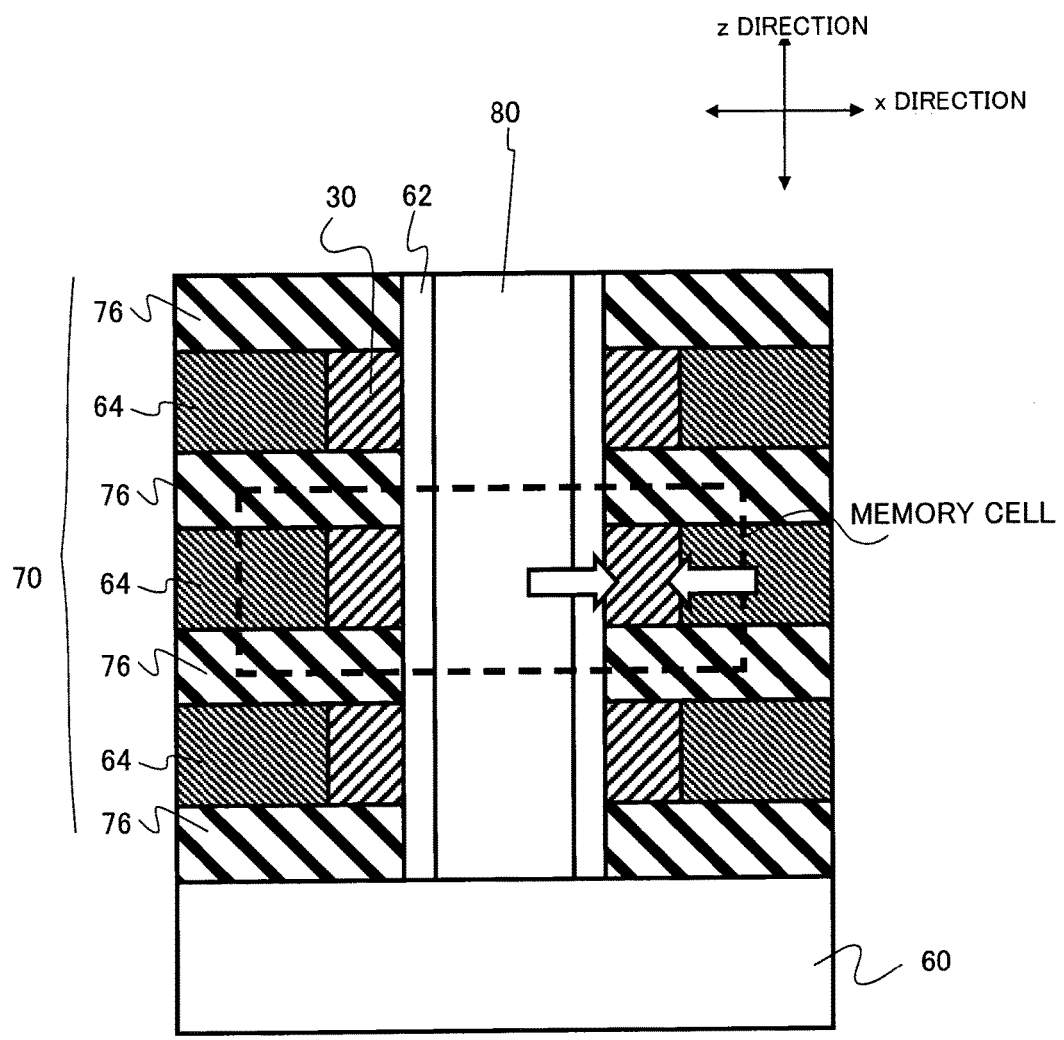
FIG. 20 is a schematic cross sectional view of a semiconductor device according to a sixth embodiment.

FIG. 20 is a schematic cross sectional view of the semiconductor device according to the present embodiment.

The semiconductor device according to the present embodiment, for example, includes a stacked body 70 having an insulating layer 76 and a control gate electrode layer 64 stacked plurally and alternately on a silicon substrate 60. The insulating layer 76 is, for example, a silicon oxide film. The control gate electrode layer (second conductive layer) 64 is formed, for example, of polycrystalline silicon doped with an impurity and provided with conductivity.

A hole penetrating from the upper surface of the stacked body 70 to the control gate electrode layer 64 as the lowest layer is provided. A dielectric film 30 is provided on a side surface of the control gate electrode layer 64 in the hole.

The dielectric film 30 is a ferroelectric film or a ferrielectric film. The dielectric film 30 is formed of hafnium oxide in which a compressive stress is applied in a thickness direction. That is, a stress is applied in a direction indicated by a white arrow in FIG. 20.

For example, it is possible to apply a compressive stress in the thickness direction of the dielectric film 30 by applying a material having a coefficient of thermal expansion smaller than hafnium oxide to the insulating layer 76.

Furthermore, a gate insulating film 62 is provided on an inner surface of the dielectric film 30. The gate insulating film 62 is, for example, a silicon oxide film. The gate insulating film 62 is not necessarily required because of the same reason as that in the third embodiment.

A pillar-shaped semiconductor layer (first conductive layer) 80 is formed on an inner surface of the gate insulating film 62. The semiconductor layer 80 is formed, for example, of silicon (Si).

In FIG. 20, an area surrounded by a broken line is one memory cell. In a structure of the memory cell, the gate insulating film 62 is formed on the semiconductor layer (first conductive layer) 80, the dielectric film 30 is formed on the gate insulating film 62, and the control gate electrode layer 64 is formed on the dielectric film 30. This memory cell is a cell of the 1 transistor type FeFET, and these cells are longitudinally connected in series.

In the semiconductor device according to the present embodiment, the coercive electric field is reduced by applying a compressive stress in the thickness direction to the ferroelectric film or the ferrielectric film formed of hafnium oxide. Therefore, the semiconductor device which operates at a low operating voltage and reduces power consumption can be realized.

In addition, according to the present embodiment, an integration degree of the memory cell is enhanced by making the memory cell three-dimensional, and it is possible to realize the semiconductor device having a higher integration degree than that in the first or fourth embodiment.

Figure 21:
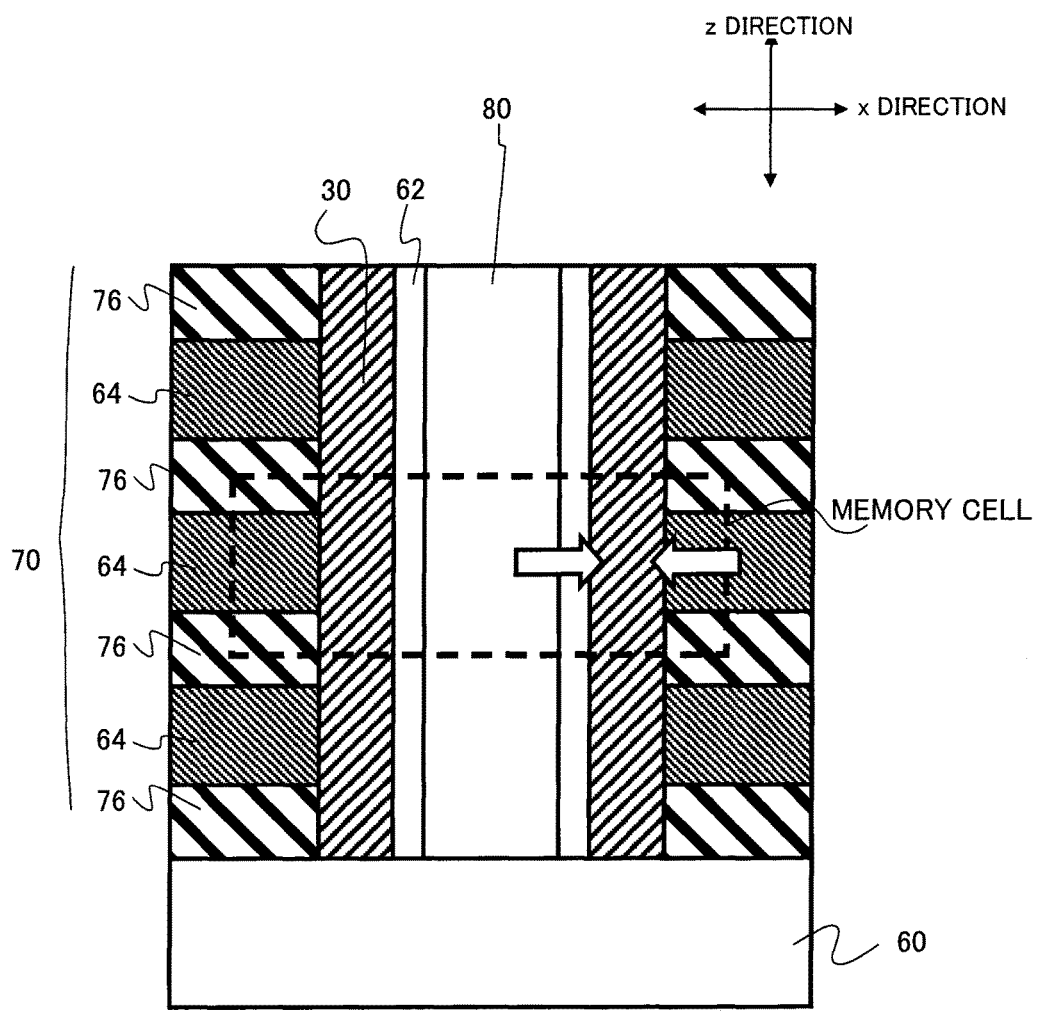
FIG. 21 is a schematic cross sectional view of a semiconductor device according to a modification example of the sixth embodiment.

FIG. 21 is a schematic cross sectional view of a semiconductor device according to a modification example of the present embodiment. The semiconductor device according to the modification example is similar to that in the above-described embodiment except that the dielectric film 30 is not divided for each memory cell and continuous in the semiconductor device according to the modification example. Also in this modification example, it is possible to obtain similar effects to those in the above-described embodiment.

Seventh Embodiment

A semiconductor device according to the present embodiment is different from that in the first or third embodiment in that the semiconductor device according to the present embodiment is a nonvolatile semiconductor device using a tunnel junction element including a ferroelectric substance or a ferrielectric substance. A structure of a dielectric film is similar to that in the first or third embodiment. Therefore, some contents overlapping with the first or third embodiment are not described.

Figure 22:
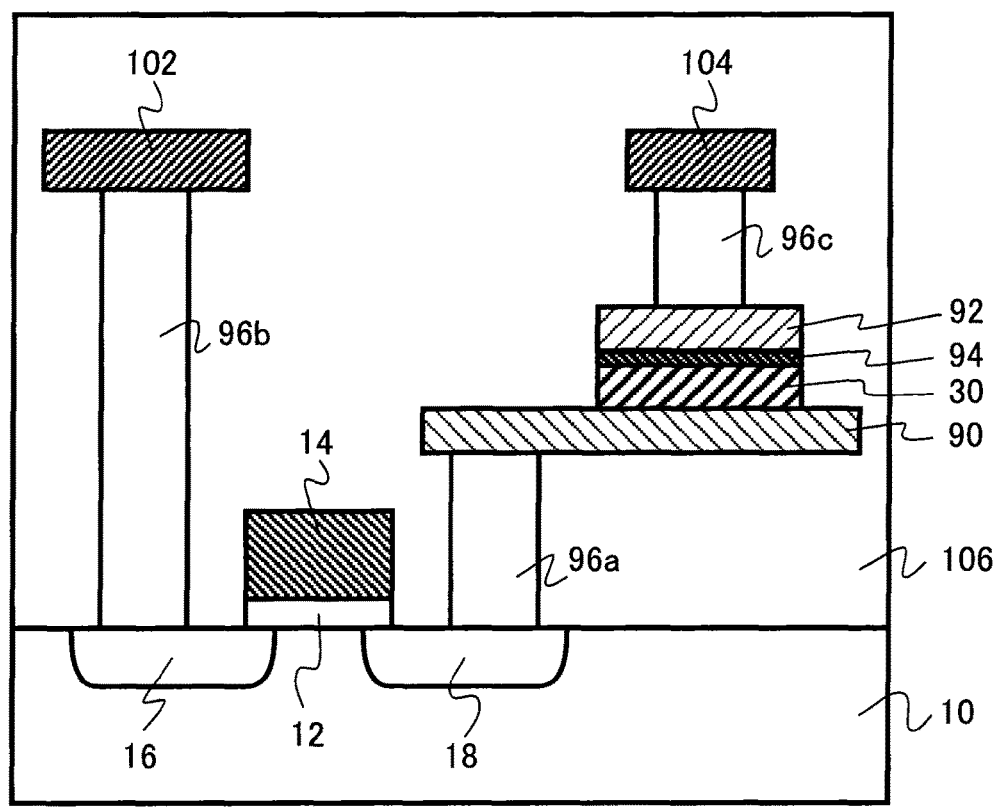
FIG. 22 is a schematic cross sectional view of a semiconductor device according to a seventh embodiment.

FIG. 22 is a schematic cross sectional view of the semiconductor device according to the present embodiment. The semiconductor device according to the present embodiment is a nonvolatile semiconductor device using a tunnel junction element including a ferroelectric substance or a ferrielectric substance.

The semiconductor device according to the present embodiment includes a semiconductor substrate 10, a gate insulating film 12 formed on the semiconductor substrate 10, and a gate electrode 14 formed on the gate insulating film 12. A source impurity layer 16 and a drain impurity layer 18 are formed on a surface of the semiconductor substrate 10 on both sides of the gate electrode 14. The semiconductor substrate 10, the gate insulating film 12, the gate electrode 14, the source impurity layer 16, and the drain impurity layer 18 constitute a transistor for selecting a memory cell. The gate electrode 14 functions as a word line of the FTJ.

The semiconductor substrate 10 is formed, for example, of silicon (Si). The gate insulating film 12 is, for example, a silicon oxide film. The gate electrode 14 is formed, for example, of polycrystalline silicon doped with an impurity. The source impurity layer 16 and the drain impurity layer 18 are formed, for example, by diffusing arsenic (As) as an n-type impurity in the semiconductor substrate 10.

In addition, the semiconductor device according to the present embodiment includes a lower electrode (first conductive layer) 90 and an upper electrode (second conductive layer) 92. A dielectric film 30 is formed between the lower electrode 90 and the upper electrode 92. An insulating film 94 is provided between the dielectric film 30 and the upper electrode 92. The lower electrode 90, the dielectric film 30, the insulating film 94, and the upper electrode 92 constitute the tunnel junction element.

The lower electrode 90 and the upper electrode 92 are formed, for example, of conductive metal or a conductive metal compound. For example, the lower electrode 90 is formed of TiN (titanium nitride). For example, the upper electrode 92 is formed of Au (gold).

The dielectric film 30 is a ferroelectric film or a ferrielectric film. The dielectric film 30 is formed of hafnium oxide containing at least one first element selected from Zn (zinc), Mg (magnesium), Mn (manganese), Nb (niobium), Sc (scandium), Fe (iron), Cr (chromium), Co (cobalt), In (indium), Li (lithium), and N (nitrogen).

The drain impurity layer 18 and the lower electrode 90 are electrically connected to each other via a contact plug 96a. The semiconductor device according to the present embodiment includes a first bit line 102 and a second bit line 104. The first bit line 102 is electrically connected to the source impurity layer 16 via a contact plug 96b. The second bit line 104 is connected to the upper electrode 92 via a contact plug 96c. The first bit line 102, the second bit line 104, and the contact plugs 96a, 96b, and 96c are formed, for example, of conductive metal or a conductive metal compound.

An interlayer insulating film 106 is provided among the wiring, the electrodes, and the contact plugs. The interlayer insulating film 106 is, for example, a silicon oxide film.

At the time of writing, the FTJ according to the present embodiment selects a memory cell with the word line and applies a voltage between the first bit line 102 and the second bit line 104 to thereby change a polarization direction of the dielectric film 30. At the time of reading, the FTJ determines 1/0 with a pulse current value flowing between the first bit line 102 and the second bit line 104.

In the semiconductor device according to the present embodiment, the coercive electric field is reduced while the spontaneous polarization is maintained by adding the first element to the ferroelectric film or the ferrielectric film formed of hafnium oxide. Therefore, the semiconductor device which operates at a low operating voltage and reduces power consumption can be realized.

Eighth Embodiment

A semiconductor device according to the present embodiment is different from that in the second or fourth embodiment in that the semiconductor device according to the present embodiment is a nonvolatile semiconductor device using a tunnel junction element including a ferroelectric substance or a ferrielectric substance. A structure of a dielectric film is similar to that in the second or fourth embodiment. Therefore, some contents overlapping with the second or fourth embodiment are not described.

Figure 23:
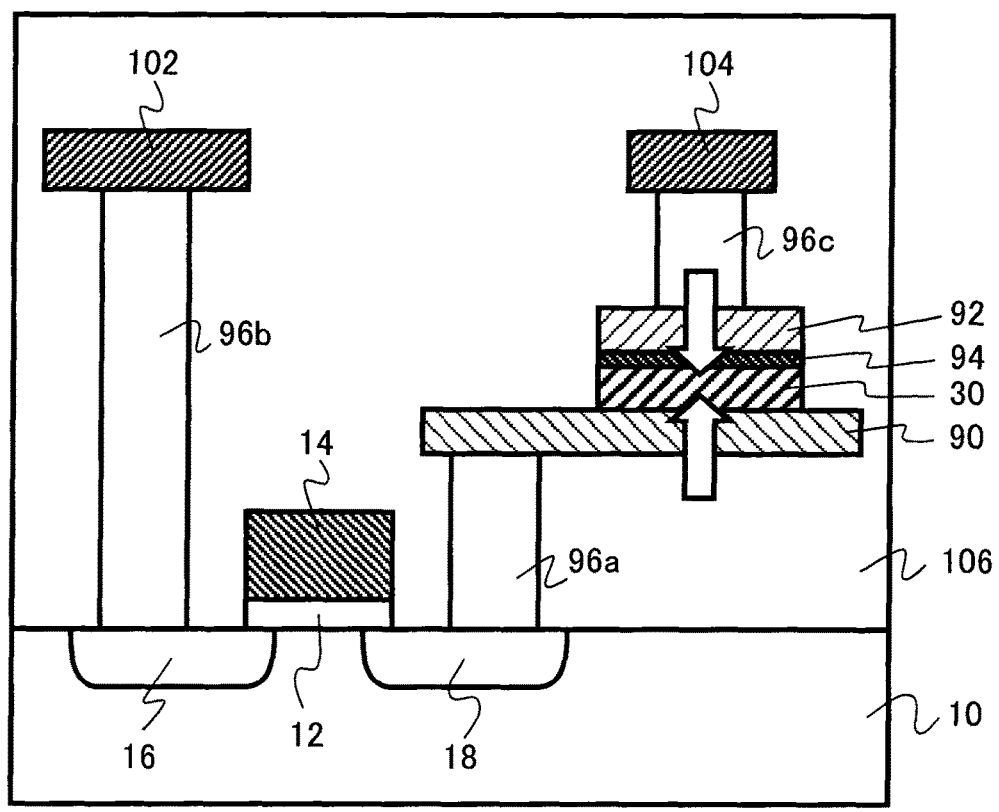
FIG. 23 is a schematic cross sectional view of a semiconductor device according to an eighth embodiment.

FIG. 23 is a schematic cross sectional view of the semiconductor device according to the present embodiment. The semiconductor device according to the present embodiment is a nonvolatile semiconductor device using a tunnel junction element including a ferroelectric substance or a ferrielectric substance.

The semiconductor device according to the present embodiment includes a semiconductor substrate 10, a gate insulating film 12 formed on the semiconductor substrate 10, and a gate electrode 14 formed on the gate insulating film 12. A source impurity layer 16 and a drain impurity layer 18 are formed on a surface of the semiconductor substrate 10 on both sides of the gate electrode 14. The semiconductor substrate 10, the gate insulating film 12, the gate electrode 14, the source impurity layer 16, and the drain impurity layer 18 constitute a transistor for selecting a memory cell. The gate electrode 14 functions as a word line of the FTJ.

The semiconductor substrate 10 is formed, for example, of silicon (Si). The gate insulating film 12 is, for example, a silicon oxide film. The gate electrode 14 is formed, for example, of polycrystalline silicon doped with an impurity. The source impurity layer 16 and the drain impurity layer 18 are formed, for example, by diffusing arsenic (As) as an n-type impurity in the semiconductor substrate 10.

In addition, the semiconductor device according to the present embodiment includes a lower electrode (first conductive layer) 90 and an upper electrode (second conductive layer) 92. A dielectric film 30 is formed between the lower electrode 90 and the upper electrode 92. An insulating film 94 is provided between the dielectric film 30 and the upper electrode 92. The lower electrode 90, the dielectric film 30, the insulating film 94, and the upper electrode 92 constitute the tunnel junction element.

The lower electrode 90 and the upper electrode 92 are formed, for example, of conductive metal or a conductive metal compound. For example, the lower electrode 90 is formed of TiN (titanium nitride). For example, the upper electrode 92 is formed of Au (gold).

The dielectric film 30 is a ferroelectric film or a ferrielectric film. The dielectric film 30 is formed of hafnium oxide in which a compressive stress is applied in a thickness direction. That is, a stress is applied in a direction indicated by a white arrow in FIG. 23.

The drain impurity layer 18 and the lower electrode 90 are electrically connected to each other via a contact plug 96a. The semiconductor device according to the present embodiment includes a first bit line 102 and a second bit line 104. The first bit line 102 is electrically connected to the source impurity layer 16 via a contact plug 96b. The second bit line 104 is connected to the upper electrode 92 via a contact plug 96c. The first bit line 102, the second bit line 104, and the contact plugs 96a, 96b, and 96c are formed, for example, of conductive metal or a conductive metal compound.

An interlayer insulating film 106 is provided among the wiring, the electrodes, and the contact plugs. The interlayer insulating film 106 is, for example, a silicon oxide film.

At the time of writing, the FTJ according to the present embodiment selects a memory cell with the word line and applies a voltage between the first bit line 102 and the second bit line 104 to thereby change a polarization direction of the dielectric film 30. At the time of reading, the FTJ determines 1/0 with a pulse current value flowing between the first bit line 102 and the second bit line 104.

In the semiconductor device according to the present embodiment, the coercive electric field is reduced by applying a compressive stress in the thickness direction to the ferroelectric film or the ferrielectric film formed of hafnium oxide. Therefore, the semiconductor device which operates at a low operating voltage and reduces power consumption can be realized.

Ninth Embodiment

A semiconductor device according to the present embodiment is different from that in the first or third embodiment in that the semiconductor device according to the present embodiment is a nonvolatile semiconductor device using a tunnel junction element including a ferroelectric substance or a ferrielectric substance. A structure of a dielectric film is similar to that in the first or third embodiment. Therefore, some contents overlapping with the first or third embodiment are not described.

Figure 24:
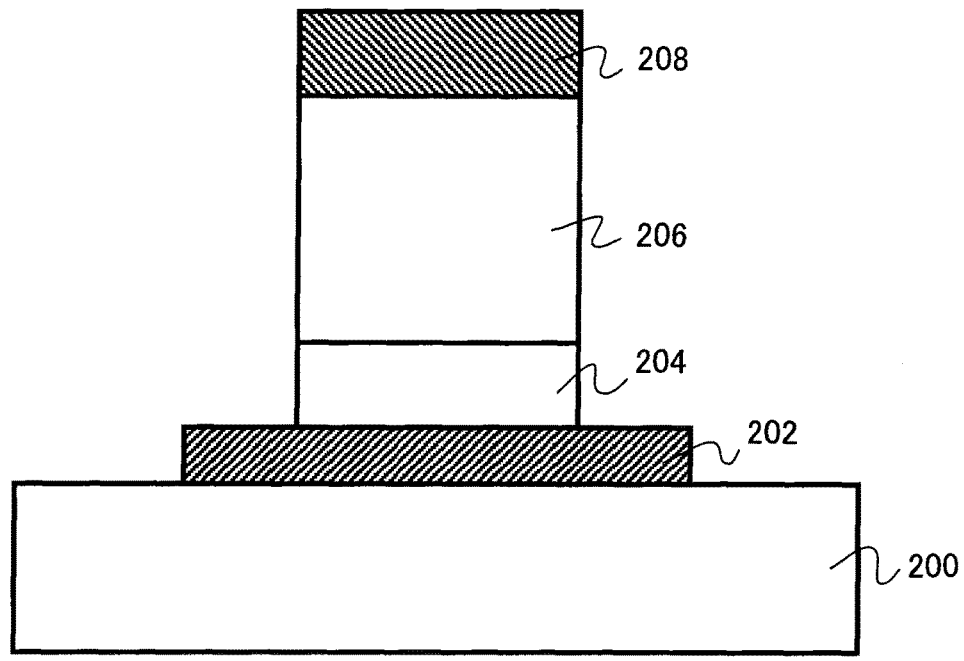
FIG. 24 is a schematic cross sectional view of a semiconductor device according to a ninth embodiment.

FIG. 24 is a schematic cross sectional view of the semiconductor device according to the present embodiment. The semiconductor device according to the present embodiment is a nonvolatile semiconductor device using a tunnel junction element including a ferroelectric substance or a ferrielectric substance.

The semiconductor device according to the present embodiment includes a substrate 200 and lower wiring 202 formed on the substrate 200. The semiconductor device according to the present embodiment includes a rectifier element 204 for selecting a memory on the lower wiring 202. The rectifier element 204 is not necessarily an essential component.

A resistance change element 206 is formed on the rectifier element 204, and upper wiring 208 is formed on the resistance change element 206. Each of the lower wiring 202 and the upper wiring 208 functions as a bit line or a word line. The semiconductor device according to the present embodiment is a nonvolatile semiconductor device including a cross point type memory cell.

Figure 25:
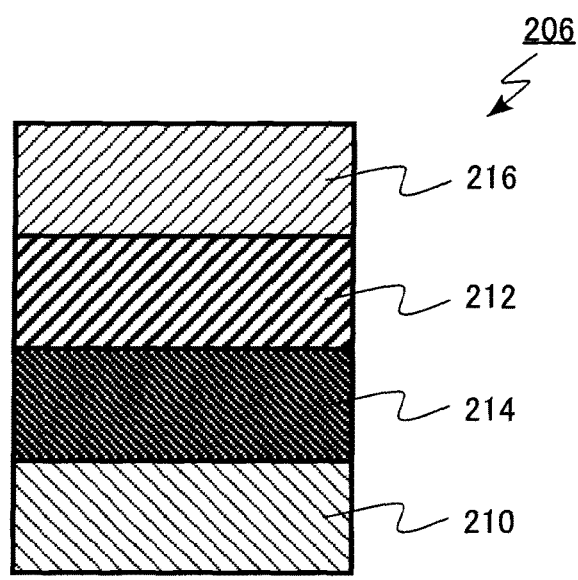
FIG. 25 is a schematic cross sectional view of a first structural example of a resistance change element according to the ninth embodiment.

FIG. 25 is a schematic cross sectional view of a first structural example of the resistance change element in the present embodiment. The resistance change element 206 includes a lower electrode 210, a second dielectric film 214 on the lower electrode 210, a first dielectric film 212 on the second dielectric film 214, and an upper electrode 216 on the first dielectric film 212.

The upper wiring 208 may also function as the upper electrode 216. The lower wiring 202 may also function as the lower electrode 210.

Figure 26:
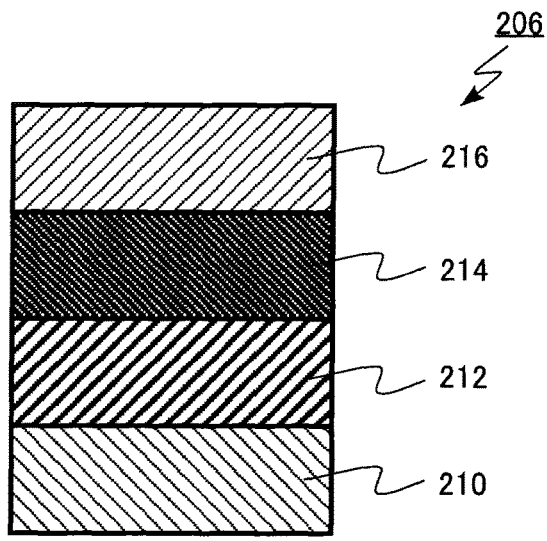
FIG. 26 is a schematic cross sectional view of a second structural example of the resistance change element according to the ninth embodiment.

FIG. 26 is a schematic cross sectional view of a second structural example of the resistance change element in the present embodiment. The resistance change element 206 includes the lower electrode 210, the first dielectric film 212 on the lower electrode 210, the second dielectric film 214 on the first dielectric film 212, and the upper electrode 216 on the second dielectric film 214.

The upper wiring 208 may also function as the upper electrode 216. The lower wiring 202 may also function as the lower electrode 210.

Figure 27:
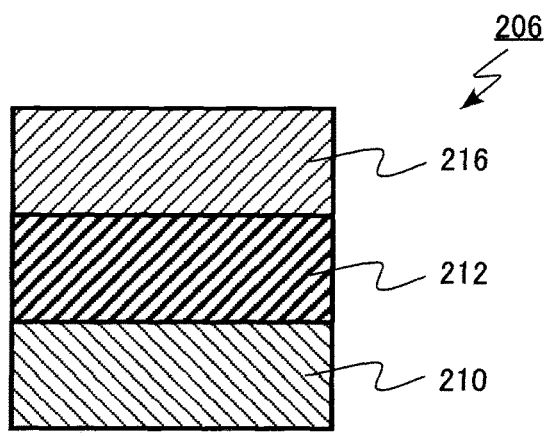
FIG. 27 is a schematic cross sectional view of a third structural example of the resistance change element according to the ninth embodiment.

FIG. 27 is a schematic cross sectional view of a third structural example of the resistance change element in the present embodiment. The resistance change element 206 includes the lower electrode 210, the first dielectric film 212 on the lower electrode 210, and the upper electrode 216 on the first dielectric film 212.

The upper electrode 216 and the lower electrode 210 are electrical conductors formed of different materials. The upper wiring 208 may also function as the upper electrode 216. The lower wiring 202 may also function as the lower electrode 210.

The lower electrode 210 and the upper electrode 216 are formed, for example, of conductive metal or a conductive metal compound in the first to third structural examples. For example, the lower electrode 210 is formed of TiN (titanium nitride). For example, the upper electrode 216 is formed of Ta (tantalum).

The first dielectric film 212 is a ferroelectric film or a ferrielectric film. The first dielectric film 212 is formed of hafnium oxide containing at least one first element selected from Zn (zinc), Mg (magnesium), Mn (manganese), Nb (niobium), Sc (scandium), Fe (iron), Cr (chromium), Co (cobalt), In (indium), Li (lithium), and N (nitrogen).

At the time of writing, the memory according to the present embodiment selects a memory cell with the word line and the bit line, and applies a voltage between the word line and the bit line to thereby change a polarization direction of the first dielectric film 212. At the time of reading, the memory determines 1/0 with a current value flowing between the bit line and the word line.

When using the rectifier element 204 in the present embodiment, it is possible to prevent a current from flowing in other parts than the memory cell selected with the word line and the bit line.

On the other hand, when the rectifier element 204 is not used in the present embodiment, the resistance change element 206 itself in the first to third structural examples is made to have a rectifying function. It is possible to simplify the memory structure by using such a structure. Therefore, a structure more suitable for increasing a capacity is obtained.

In the semiconductor device according to the present embodiment, the coercive electric field is reduced while the spontaneous polarization is maintained by adding the first element to the ferroelectric film or the ferrielectric film formed of hafnium oxide. Therefore, the semiconductor device which operates at a low operating voltage and reduces power consumption can be realized.

Tenth Embodiment

A semiconductor device according to the present embodiment is different from that in the second or fourth embodiment in that the semiconductor device according to the present embodiment is a nonvolatile semiconductor device using a tunnel junction element including a ferroelectric substance or a ferrielectric substance. A structure of a dielectric film is similar to that in the second or fourth embodiment. Therefore, some contents overlapping with the second or fourth embodiment are not described.

Figure 28:
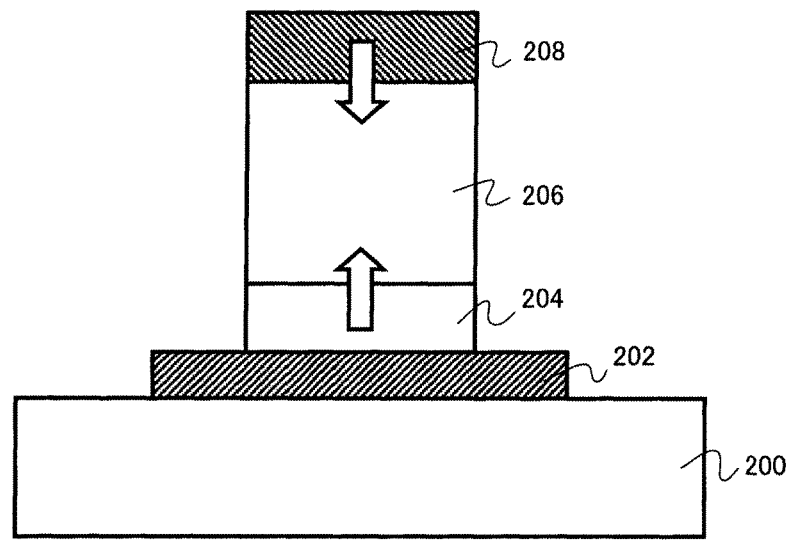
FIG. 28 is a schematic cross sectional view of a semiconductor device according to a tenth embodiment.

FIG. 28 is a schematic cross sectional view of the semiconductor device according to the present embodiment. The semiconductor device according to the present embodiment is a nonvolatile semiconductor device using a tunnel junction element including a ferroelectric substance or a ferrielectric substance.

The semiconductor device according to the present embodiment includes a substrate 200 and lower wiring 202 formed on the substrate 200. The semiconductor device according to the present embodiment includes a rectifier element 204 for selecting a memory on the lower wiring 202. The rectifier element 204 is not necessarily an essential component.

A resistance change element 206 is formed on the rectifier element 204, and upper wiring 208 is formed on the resistance change element 206. Each of the lower wiring 202 and the upper wiring 208 functions as a bit line or a word line. The semiconductor device according to the present embodiment is a nonvolatile semiconductor device including a cross point type memory cell.

Figure 29:
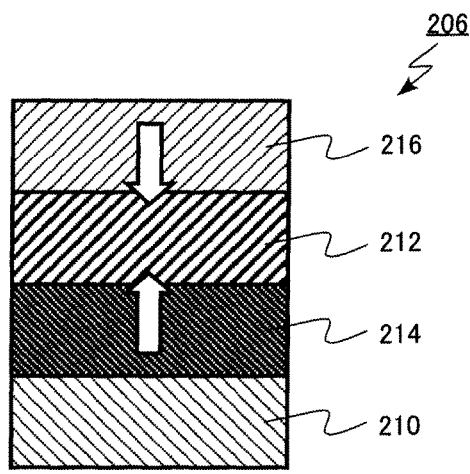
FIG. 29 is a schematic cross sectional view of a first structural example of a resistance change element according to the tenth embodiment.

FIG. 29 is a schematic cross sectional view of a first structural example of the resistance change element in the present embodiment. The resistance change element 206 includes a lower electrode 210, a second dielectric film 214 on the lower electrode 210, a first dielectric film 212 on the second dielectric film 214, and an upper electrode 216 on the first dielectric film 212.

The upper wiring 208 may also function as the upper electrode 216. The lower wiring 202 may also function as the lower electrode 210.

Figure 30:
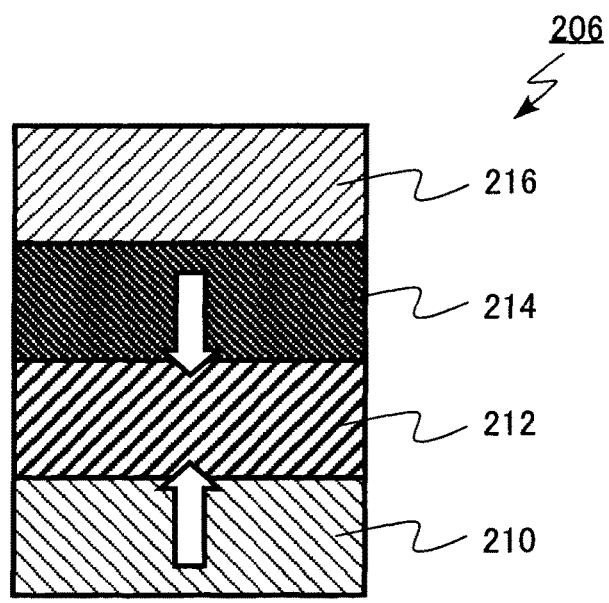
FIG. 30 is a schematic cross sectional view of a second structural example of the resistance change element according to the tenth embodiment.

FIG. 30 is a schematic cross sectional view of a second structural example of the resistance change element in the present embodiment. The resistance change element 206 includes the lower electrode 210, the first dielectric film 212 on the lower electrode 210, the second dielectric film 214 on the first dielectric film 212, and the upper electrode 216 on the second dielectric film 214.

The upper wiring 208 may also function as the upper electrode 216. The lower wiring 202 may also function as the lower electrode 210.

Figure 31:
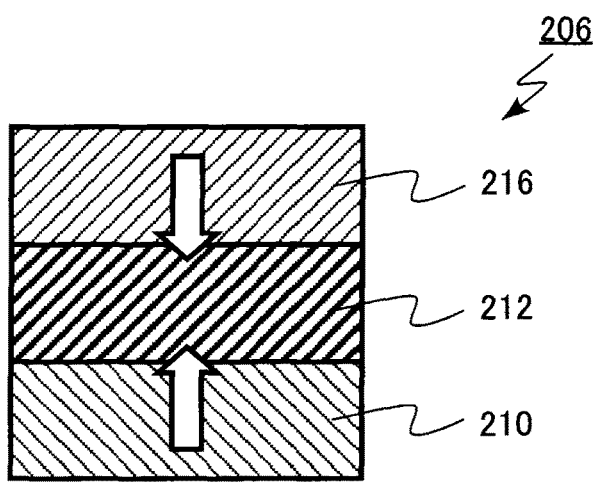
FIG. 31 is a schematic cross sectional view of a third structural example of the resistance change element according to the tenth embodiment.

FIG. 31 is a schematic cross sectional view of a third structural example of the resistance change element in the present embodiment. The resistance change element 206 includes the lower electrode 210, the first dielectric film 212 on the lower electrode 210, and the upper electrode 216 on the first dielectric film 212.

The upper electrode 216 and the lower electrode 210 are electrical conductors formed of different materials. The upper wiring 208 may also function as the upper electrode 216. The lower wiring 202 may also function as the lower electrode 210.

The lower electrode 210 and the upper electrode 216 are formed, for example, of conductive metal or a conductive metal compound in the first to third structural examples. For example, the lower electrode 210 is formed of TiN (titanium nitride). For example, the upper electrode 216 is formed of Ta (tantalum).

The first dielectric film 212 is a ferroelectric film or a ferrielectric film. The first dielectric film 212 is formed of hafnium oxide in which a compressive stress is applied in a thickness direction. That is, a stress is applied in a direction indicated by a white arrow in FIGS. 28, 29, 30, and 31.

At the time of writing, the memory according to the present embodiment selects a memory cell with the word line and the bit line, and applies a voltage between the word line and the bit line to thereby change a polarization direction of the first dielectric film 212. At the time of reading, the memory determines 1/0 with a current value flowing between the bit line and the word line.

When using the rectifier element 204 in the present embodiment, it is possible to prevent a current from flowing in other parts than the memory cell selected with the word line and the bit line.

On the other hand, when the rectifier element 204 is not used in the present embodiment, the resistance change element 206 itself in the first to third structural examples is made to have a rectifying function. It is possible to simplify the memory structure by using such a structure. Therefore, a structure more suitable for increasing a capacity is obtained.

In the semiconductor device according to the present embodiment, the coercive electric field is reduced by applying a compressive stress in the thickness direction to the ferroelectric film or the ferrielectric film formed of hafnium oxide. Therefore, the semiconductor device which operates at a low operating voltage and reduces power consumption can be realized.

Hitherto, the embodiments have exemplified the semiconductor device to which a ferroelectric film or a ferrielectric film formed of hafnium oxide and having a reduced coercive electric field while maintaining spontaneous polarization is applied. However, it is also possible to apply a similar film to a device using a ferroelectric film or a ferrielectric film, other than the semiconductor device. For example, it is also possible to apply the similar film to an infrared sensor.

While certain embodiments have been described, these embodiments have been presented by way of example only, and are not intended to limit the scope of the inventions. Indeed, the semiconductor device and the dielectric film described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
    a first conductive layer;
    a second conductive layer; and
    a ferroelectric film or a ferrielectric film provided between the first conductive layer and the second conductive layer, the ferroelectric film including hafnium oxide containing at least one first element selected from the group consisting of Zn, Nb, Fe, Cr, and Li, and the ferrielectric film including hafnium oxide containing at least one first element selected from the group consisting of Zn, Nb, Fe, Cr, and Li,
    wherein
    the hafnium oxide includes third orthorhombic hafnium oxide.

2. The device according to claim 1, wherein
    the hafnium oxide contains at least one second element selected from Si, Ti, Zr, Al, or Y.

3. The device according to claim 2, wherein
    the at least one second element is contained at 1 atom % or more and 5 atom % or less in the hafnium oxide.

4. The device according to claim 1, wherein
    the at least one first element is contained at 1 atom % or more and 10 atom % or less in the hafnium oxide.

5. The device according to claim 1, wherein
    a compressive stress is applied in a thickness direction of the ferroelectric film or the ferrielectric film.

6. The device according to claim 1, wherein
    the at least one first element is Zn, or Nb.

7. A semiconductor device comprising:
    a first conductive layer;
    a second conductive layer; and
    a ferroelectric film or a ferrielectric film provided between the first conductive layer and the second conductive layer, the ferroelectric film including hafnium oxide containing at least one first element selected from the group consisting of Fe and Cr, and the ferrielectric film including hafnium oxide containing at least one first element selected from the group consisting of Fe and Cr.

8. The device according to claim 7, wherein
    the hafnium oxide contains at least one second element selected from Si, Ti, Zr, Al, or Y.

9. The device according to claim 8, wherein
    the at least one second element is contained at 1 atom % or more and 5 atom % or less in the hafnium oxide.

10. The device according to claim 7, wherein
    the at least one first element is contained at 1 atom % or more and 10 atom % or less in the hafnium oxide.

* * * * *